(12) United States Patent
Drndic et al.

(10) Patent No.: US 8,039,368 B2
(45) Date of Patent: Oct. 18, 2011

(54) NANOGAPS: METHODS AND DEVICES CONTAINING SAME

(75) Inventors: Marija Drndic, Philadelphia, PA (US); Michael Fischbein, Philadelphia, PA (US)

(73) Assignee: The Trustees of The University of Pennsylvania, Philadelphia, PA (US)

( * ) Notice: Subject to any disclaimer, the term of this patent is extended or adjusted under 35 U.S.C. 154(b) by 404 days.

(21) Appl. No.: 11/909,356

(22) PCT Filed: Mar. 21, 2006

(86) PCT No.: PCT/US2006/010157
§ 371 (c)(1),
(2), (4) Date: Jul. 9, 2009

(87) PCT Pub. No.: WO2006/102292
PCT Pub. Date: Sep. 28, 2006

(65) Prior Publication Data
US 2010/0142259 A1    Jun. 10, 2010

Related U.S. Application Data

(60) Provisional application No. 60/663,637, filed on Mar. 21, 2005, provisional application No. 60/715,720, filed on Sep. 9, 2005.

(30) Foreign Application Priority Data

May 25, 2005   (WO) ................. PCT/US2005/018342

(51) Int. Cl.
*H01L 21/20* (2006.01)

(52) U.S. Cl. ................. 438/478; 257/E23.145
(58) Field of Classification Search .............. None
See application file for complete search history.

(56) References Cited

U.S. PATENT DOCUMENTS

| | | |
|---|---|---|
| 6,159,620 A | 12/2000 | Heath et al. |
| 6,586,787 B1 | 7/2003 | Shih et al. |
| 6,635,494 B2 | 10/2003 | Yamashita |
| 6,744,065 B1 | 6/2004 | Samuelson et al. |
| 6,791,338 B1 | 9/2004 | Bratkovski et al. |
| 6,815,218 B1 | 11/2004 | Jacobson et al. |
| 7,030,452 B2 * | 4/2006 | Tao et al. ............ 257/414 |
| 7,049,625 B2 | 5/2006 | Kern et al. |
| 7,067,341 B2 | 6/2006 | Mascolo et al. |
| 7,494,907 B2 | 2/2009 | Brown et al. |
| 7,615,776 B2 | 11/2009 | Chaudhari |

(Continued)

FOREIGN PATENT DOCUMENTS

WO    WO 200407636 A1    1/2004

OTHER PUBLICATIONS

May et al., "Photolithography", The Virtual Cleanroom Project, http://www.ece.gatech.edu/research/labs/vc/processes/photoLith.html, accessed on Aug. 9, 2010, 14 pages.

(Continued)

*Primary Examiner* — Thao Le
(74) *Attorney, Agent, or Firm* — Woodcock Washburn, LLP

(57) ABSTRACT

Disclosed are methods of fabricating nanogaps and various devices composed of nanogaps. The nanogap devices disclosed herein can be used as in a number of electronic, photonic and quantum mechanical devices, including field-effect transistors and logic circuits.

64 Claims, 24 Drawing Sheets

U.S. PATENT DOCUMENTS

| | | | |
|---|---|---|---|
| 2001/0006844 | A1 | 7/2001 | Park et al. |
| 2001/0024845 | A1 | 9/2001 | Oszustowicz |
| 2003/0034486 | A1 | 2/2003 | Korgel |
| 2003/0040173 | A1* | 2/2003 | Fonash et al. ............. 438/622 |
| 2003/0067668 | A1 | 4/2003 | Feldheim et al. |
| 2003/0103367 | A1 | 6/2003 | Aeppli et al. |
| 2004/0002195 | A1* | 1/2004 | Brousseau, III ............. 438/301 |
| 2004/0029050 | A1 | 2/2004 | Brenner et al. |
| 2004/0169195 | A1 | 9/2004 | Song |
| 2006/0234417 | A1 | 10/2006 | Isobe et al. |

OTHER PUBLICATIONS

Berggren et al., "Demonstration of a Nanolithographic Technique Using a Self-Assembled Monolayer Resist for Neutral Atomic Cesium", Advanced Materials, Jan. 1997, 9(1), 52-55.

Bezryadin et al., "Nanofabrication of Electrodes With sub-5 nm Spacing for Transport Experiments on Single Molecules and Metal Clusters", Scl Technol., B, May 1997, 15(4), 793-799.

Broers et al., "Electron-beam fabrication of 80-A metal structures", App. Phys. Lett., Nov. 1976, 29(9), 596-598.

Broers, "Resolution limits for electron-beam lithography", IBM J. of Res. Develop., Jul. 1988, 32(4), 502-513.

Cartlidge, "Atom lithography sees the light", PhysicsWeb, Oct. 1, 2002, http://physicsweb.Org/articles/news/6/10/2/l, 1 page.

Chang, "Proximity effect in electron-beam lithography", J. Vac. Sd. Technol. B., Nov. 1975, 12(6), 1271-1275.

Chen et al., "Large on-off rations and negative differential resistance in a molecular electronic device", Science, New Series, Nov. 19, 1999, 286(5444), 1550-1552.

Cui et al., "Overview of greyscale photolithography for microoptical elements fabrication", Source: Proceedings of the SPIE—The International Society for Optical Engineering, Jan. 17, 2003, 4984, 111-117.

Grant et al., "Transmission electron microscopy 'windows' for nanofabricated structures", Nanotechnol., Jul. 16, 2004, 15(9), 1175-1181.

Johnson et al., "Localization of Metastable Atom Beams With Optical Standing Waves: Nanolithography at the Heisenberg Limit", Science, Jun. 5, 1998, 280(5369), 1583-1586.

Klein et al., "A single-electron transistor made from cadmium selenide nanocrystal", Nature, Oct. 16, 1997, 389, 699-701.

Klein et al., "An approach to electrical studies of single nanocrystals", hys. Lett., Apr. 29, 1996, 68(18), 2574-2576.

Koltsov, "Computer simulation of positive-resist photolithography", Russian Res. Inst. of Microelectron Technology, Moscow, Russia, Smolyanitskii, LYa, Tsygankov, V.Yu, Source: Mikroelektronika, Jan.-Feb. 1995, 24(1), 52-62.

Krahne et al., "Fabrication of nanoscale gaps in integrated circuits", J. Appl. Phys. Lett., Jul. 22, 2002, 81(4), 730-732.

Liu et al., "Simple fabrication scheme fro sub-10 nm electrode gaps using electron-beam lithography", App. Phys. Lett., Feb. 2002, 80(5), 865-867.

Lutwyche, "The resolution of electron beam lithography", Microelec. Eng., Mar. 1992, 17(1-4), 17-20.

Ma, "Making silicon nitride film a viable gate dielectric", IEEE Trans. Electron Devices, Mar. 1998, 45(3), 680-690.

Mei, "High Integration in Microelectronics", Proceedings of the First Workshop Conference: Microlithography, World Scientific, Rio de Janeiro, Brazil, Aug. 28-Sep. 1, 1989, 77-93.

Morkved et al., "Silicon nitride membrane substrates for the investigation of local structure in polymer thin films", Polymer Communications, Elsevier Science Ltd., Jul. 1998, 39(16), 3871-3875.

Morpurgo et al., "Controlled fabrication of metallic electrodes with atomic separation", App. Phys. Lett., Apr. 5, 1999, 74(14), 2084-2086.

Ouyang et al., "Reports Coherent Spin Transfer Between Molecularly Bridged Quantum Dots", Science, Aug. 22, 2003, 301(5636), 1074-1078.

Pandey et al., "Growth and characterization of silicon nitride films for optoelectronics applications", J. Opt. Mat., Nov. 2004, 27(2), 139-146.

Parikh et al., "Energy deposition functions in electron resist films on substrates", J. Appl. Phys., Feb. 1979, 50(2), 1104-1111.

Park et al., "Nanomechanical oscillations in a single-$C_{60}$ transistors", Nature, Sep. 7, 2000, 407(6800), 57-60.

Philipp et al., "Shadow evaporation method for fabrication of sub 10 nm Gaps between metal electrodes", J. Microelec. Eng., May 1999, 46(1-4), 157-160.

Qin et al., "On-Wire lithography", Science, Jul. 2005, 309(5731), 113-115.

Reed et al., "Conductance of a molecular junction", Science, Oct. 10, 1997, 278(5336), 252-254.

Rehse et al., "Nanolithography with metastable neon atoms: Enhanced rate of contamination resist formation for nanostructure fabrication", Appl. Phys. Lett., Sep. 1997, 71(10), 1427-1429.

Reyes-Betanzo et al., "Mechanisms of silicon nitride etching by electron cyclotron resonance plasmas using $SF_6$- and $NF_3$-based gas mixtures", J. Vac. Sci. Technol. A, Jul. 2004, 22(4), 1513-1518.

Scott, "The theory of small-angle multiple scattering of fast charged particles", Review of Mod. Phys., Apr. 1, 1963, 35(2), 231-313.

Service, "Quantum Dots Chemically Wired for Spintronics", Science, Aug. 1, 2003, 301(5633), 580.

Sordan et al., "Coulomb blockade phenomena in electromigartion break junctions", App. Phys. Lett., Jun. 29, 2005, 87, 013106-1-013106-3.

Strachen et al., "Controlled fabrication of nanogaps in ambient environment for molecular electronics", App. Phys. Lett., Jan. 21, 2005, 86(4), 043109-1-043109-3.

Sun et al., "Shadow-Evaporated nanometer-sized gaps and their use in electrical studies of nanocrystals", Nanotechnology, Mar. 9, 2005, 16(6), 631-634.

Taylor, "Materials and Processes at the Leading Edge of Photolithography", Electronic Packaging Materials Science Symposium, Boston, MA, Nov. 30-Dec. 4, 1987, 108, 257-274.

Teng et al., "Materials and processes in microlithography for IC fabrication", (Mater. Res. Labs., hid. Technol. Res. hist., Hsinchu, Taiwan); Source: MRL Bulletin of Research and Development, Sep. 1990, 4(2), 1-7.

Younkin et al., "Nanostructure fabrication in silicon using cesium to pattern a self-assembled monolayer", Applied Physics Letters, Sep. 1, 1997, 71(9), 1261-1263.

Zandbergen et al., "Sculpting nanoelectrodes with a transmission electron beam for electrical and geometrical characterization of nanoparticles", Nano. Lett., Mar. 2005, 5(3), 549-553.

* cited by examiner

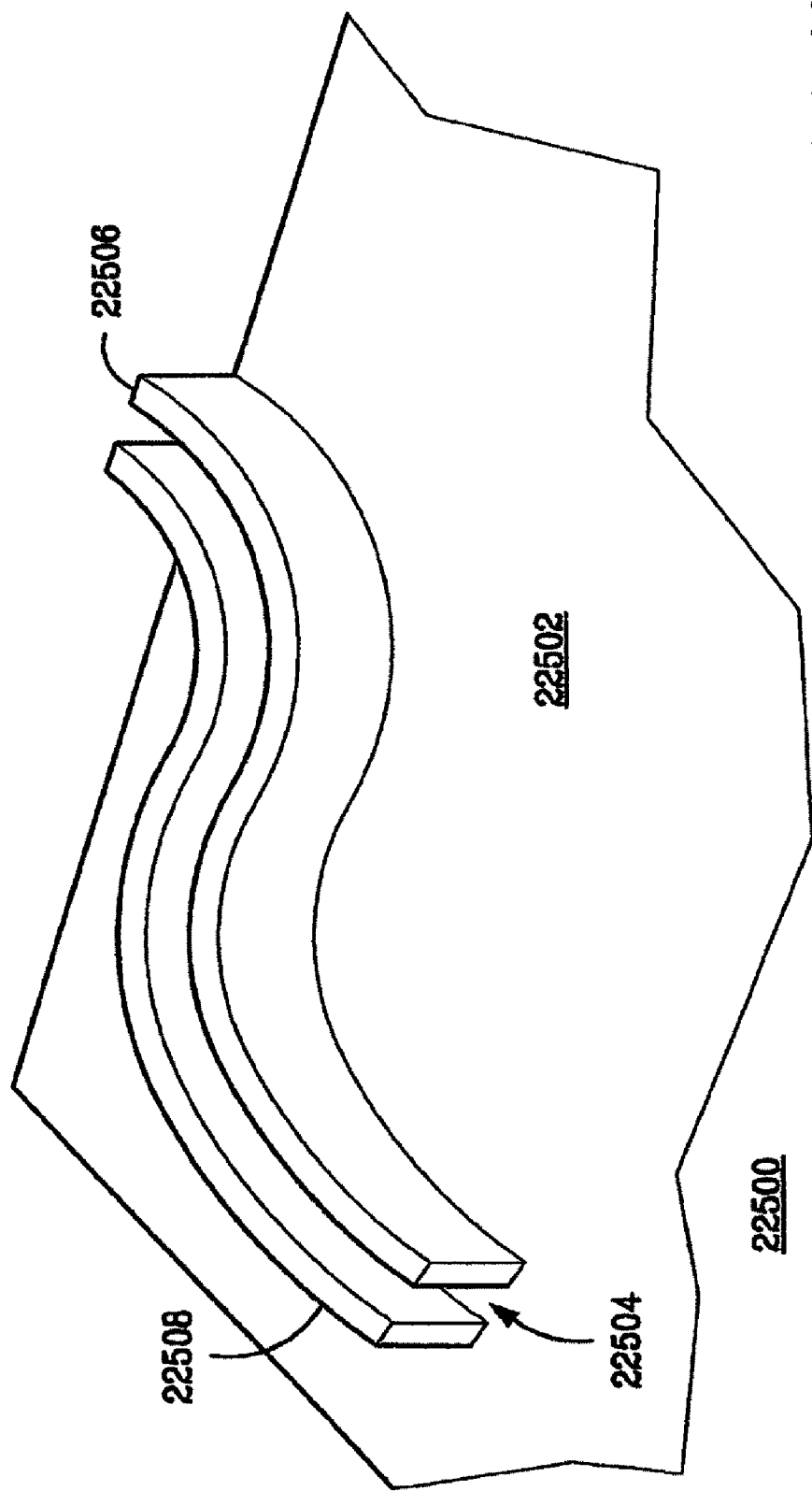

NANOGAPS: METHODS AND DEVICES CONTAINING SAME

CROSS-REFERENCE TO RELATED APPLICATIONS

This application is the National Stage of International Application No. PCT/US2006/010157 filed Mar. 21, 2006, which claims the benefit of U.S. Provisional Application No. 60/663,637, filed March 21, 2005; International Application No. PCT/US2005/018342, filed May. 25, 2005; and U.S. Provisional Application No. 60/715,720, filed Sep. 9, 2005, the disclosures of which are incorporated herein by reference in their entirety.

STATEMENT OF GOVERNMENT INTERESTS

The invention was made with U.S. Government support. The Government may have certain rights in the invention under Office of Naval Research Grant No. N000140410489 and NSF IGERT Program Grant No. DGE-0221664.

FIELD OF THE INVENTION

The present invention is generally related to the field of nanotechnology. The present invention is also related to the field of semiconductor fabrication processes, in particular the fabrication of electrodes and devices integrating nanoscale electrodes. The present invention also pertains to processes for preparing nanometer scale device features. The present invention also pertains to a variety of electronic, photonic, semiconductor and quantum effect devices.

BACKGROUND OF THE INVENTION

The last few decades have witnessed myriad breakthroughs in studies on single molecules, nanometer-scale structures and quantum phenomena in general. Exciting results continue to emerge at a rapid rate and proposed applications for them are quick to follow. In order to realize these applications and pursue research at similar and even smaller scales, reliable methods are needed to electronically connect atoms, molecules, nanostructures and other components at the nanoscale. In this regard, two or more electrical contacts separated by a nanometer scale distance constitute a "nanogap".

Charge transport measurements using nanogaps have yielded much of what is currently known about the electrical properties of objects small enough to have their properties dominated by quantum mechanics. Scanning probes have also been used to study electric properties of single crystals, but their ability to probe the lateral charge dynamics between several neighboring nano-structures is seriously limited and their potential for integration into any scalable production is unlikely.

Functional nano-electronic devices based on nanogaps have been demonstrated. For instance, transistors have been made from a single nanocrystal, a single strand of DNA, a single $C_{60}$ molecule, a single Co ion, and other single molecules containing spin impurities. However, all of the currently available techniques used to fabricate nanogaps require a lengthy and complicated fabrication process, suffer from low yield and poor control of the gap size, as well as its location on a substrate. Most of them require the skill and finesse that a limited number of people possess and many demand uncommon facilities. In most cases, the fabrication of each gap requires arduous tuning of the instrumentation parameters while simultaneously measuring the progress of the gap formation. As a consequence, automated and scalable production is not likely to be achieved with these methods. Furthermore, the structural details and content of nanogaps produced by these techniques are either difficult or impossible to determine directly.

Efforts towards developing a reliable nanogap fabrication technique have been active for over a decade. The first reported method for achieving small gaps employed angled evaporation to fabricate two closely spaced electrodes on $SiO_2$ (Klein, D. L.; McEuen, P. L.; Katari, J. E. B.; Roth, R.; Alivisatos, A. P. *App. Phys. Lett.* 1996, 68, 2574). Dekker and Bezryadin were able to fabricate gaps under 5 nm by sputtering metal onto carbon electrodes, which had been deposited near each other with an electron beam (Bezryadin, A; Dekker, C. J. *Vac. Sci. Technol. B* 1997, 15(4), 793). An analogous method developed by Marcus et al. involved first fabricating nearby electrodes and then electroplating additional metal to reduce the gap size (Morpurgo, A. F.; Marcus, C. M.; Robinson, D. B. *App. Phys. Lett.* 1999, 74, 2084). Tour et al. demonstrated a mechanical "breakjunction" technique based on first fabricating a thin continuous metal wire and forcing it to break open by introducing mechanical strain (Reed, M. A.; Zhou, C.; Muller, C. J.; Burgin, T. P.; Tour, J. M. *Science* 1997, 278, 252). The mechanical breakjunction technique was modified by Park et al. by triggering the gap formation with a sudden voltage application across the wire (Park, H.; Lim, A. K. L.; Alivisatos, A. P.; Park, J.; McEuen, P. L. *App. Phys. Lett.* 1999, 75, 301). Both of these breakjunction methods require liquid helium temperatures (4 K). Gaps fabricated using such methods are usually accompanied by randomly deposited small metallic particle debris that can distort measured signals. Park's "electromigration" technique was improved by developing a method for gradual gap formation with a sequence of slow voltage ramps, which allows the fabrication to be done at room temperature (Strachen, D. R.; Smith, D. E.; Johnston, D. E.; Park, T.-H; Therien, M. J.; Bonnell, D. A.; Johnson, A. T. *App. Phys. Lett.* 2005, 86, 043109). Many other methods for achieving nanogaps exist, though they are of similar or even greater complexity (see, for example, Chen, J.; Reed, M. A.; Rawlett, A. M.; Tour, J. M. *Science* 1999, 286, 1550; Krahne, R.; Yacoby, A.; Shtrikman, H.; Bar-Joseph, I; Dadosh, T.; Sperling, J. *Appl. Phys. Lett.* 2002, 81(4), 730; and Sun, L. F.; Chin, S. N.; Msarx, E.; Curtis, K. S.; Greenham, N. C.; Ford, C. J. B. *Nanotechnology* 2005, 16, 631). Researchers have demonstrated a simpler technique of directly writing small gaps with EBL onto a $SiO_2$ substrate by underexposing and overdeveloping the resist while carefully monitoring the temperature and development time (Liu, K.; Avouris, Ph.; Bucchignano, J.; Martel, R.; Sun, S. *App. Phys. Lett.* 2002, 80, 865). The final gap geometry is highly sensitive to these parameter values. In that case, a second writing process, requiring alignment of the incomplete device, is necessary to connect the electrode gaps to a full circuit.

In addition to the complications involved with the methods mentioned above, nanogaps that are produced are typically inspected with Scanning Electron Microscopy ("SEM"). SEM has a resolution limit roughly between 1 and 10 nm, depending on the microscope, sample properties and imaging conditions. A serious consequence of this is the potential for measuring single electron effects due to an impurity in the gap and mistaking the impurity for the sample being probed. Specifically, "Coulomb Blockade", a phenomenon attributed to the successful detection of a single nano-scale sample, was recently reported to be frequently detected in electromigrated gaps containing no sample—only debris produced during the gap formation (Sordan, R. Balasubramanian, K.; Burghard, M.; Kern, K. *App. Phys. Lett.* 2005, 87, 013106). Accordingly, rapid and reliable methods for making nanogaps and other structures on the nanometer-scale are presently needed.

Transmission Electron Microscopy ("TEM") offers the highest resolution imaging available (less than 1 Angstrom or 0.1 nanometer). Two methods for fabricating nanogaps on TEM-compatible thin films have been reported previously, however neither solve the problem in a practical manner. The first demonstrated example uses shadow evaporation, although this method suffers from an extremely low yield (Philipp, G.; Weimann, T.; Hinze, P.; Burghard, M.; Weis, *J. Microelec. Eng.* 1999, 46, 157). A second method breaks a thin wire on a $Si_3N_4$ support membrane by exposing it to a 300 kV electron beam (Zandbergen, H. W.; van Duuren, R. J. H. A.; Alkemade, P. F. A.; Lientschnig, G.; Vasquez, Dekker C.; Tichelaar, F. D. *Nano. Lett.*, 2005, 5, 549). The high energy beam drives thermal diffusion of atoms away from the targeted region until a gap suddenly opens. Although high quality TEM images are obtained, the initial gap size is difficult to control and the gaps continued to grow over time. Because this is a breakjunction technique, it is necessary to remove the substrate from underneath the gap region to avoid contamination from metallic debris. Furthermore, this technique requires deft use of a dual beam Transmission Electron Microscope (TEM), which is an extremely rare system. A technique called "On-Wire Lithography" (OWL) makes use of standard nanowire growth technology by momentarily stopping the growth of a gold nanowire, growing a thin section of another material and then resuming the growth of the gold nanowire Qin, L.; Park, S.; Huang, L.; Mirkin, C. A. *Science,* 2005, 309, 113. The continuous wire is then exposed to a wet etch that removes the non-gold material and consequently defines a gap. A large number of the final structures are then deposited on a substrate containing many pre-patterned electrodes and the experimenter is forced to hope for one of the gapped-wires to randomly span two of the electrodes. The low yield of successful integration of the gaps into a full circuit imposes a severe limitation to OWL as a viable approach to useful nanogap device production. Accordingly, there is also a present need for rapid production of nanogaps and other structures on the nanometer scale that can easily be inspected using TEM. There is also an urgent need to prepare electronic, photonic and quantum-effect devices that include such nanogaps and other nanoscale structures.

SUMMARY OF THE INVENTION

In certain aspects, the present invention provides methods for fabricating a nanogap, comprising imaging an imageable layer surmounting a support membrane; removing the imaged portions of the imageable layer to give rise to at least one nanoscale feature on the support membrane; adhering a layer of a further material onto the support membrane covering at least a portion of at least one nanoscale feature; and removing the at least one nanoscale feature from the support membrane together with the further material adhering to the nanofeature to give rise to said nanogap.

In other aspects, the present invention provides methods comprising providing a support membrane surmounted by an imageable layer on one or both sides of the support membrane; imaging the imageable layer to give rise to one or more desired nanoscale features composed of a portion of said imageable layer surmounted on one or both sides of the support membrane; optionally forming an optional adhesive layer on at least one side of the support membrane comprising said nanoscale features; forming one or more layers of one or more further materials surmounted on at least a portion of the nanoscale features, the support membrane, the optional adhesive layer, or any combination thereof; and removing at least a portion of said one or more layers of one or more further materials surmounted on at least a portion of the nanoscale features to give rise to one or more nanogaps residing proximate to one or more layers of one or more further materials surmounted on the support membrane, the optional adhesive layer, or any combination thereof.

In further aspects, the present invention also provides methods comprising imaging an imageable layer surmounting a support membrane to give rise to at least one nanoscale feature composed of a portion of said imageable layer; and etching a portion of the support membrane residing proximate to the one or more desired nanoscale features to give rise to a support membrane nanofeature composed of a portion of the support membrane.

In certain other aspects, the present invention provides methods, comprising: providing a support membrane comprising a first side and a second side, the first side comprising a region of imageable layer surmounting an insulating layer, said insulating layer surmounting a supporting layer that supports said support membrane; and the second side comprising a plurality of electrodes defining one or more nano gaps; and exposing said imageable layer to an exposure beam.

The present invention also provides devices made according to the aforementioned methods.

In other aspects, the present invention provides devices comprising: an electronically active element disposed on a back side of a support membrane supported by a supporting layer, the electronically active element comprising a back side structure connected from a region of the support membrane along a sloped surface of the supporting layer, the supporting layer being at least partially covered with an insulating layer, said insulating layer adjacently situated to said support membrane, wherein at least a portion of the back side structure is situated opposite to a nanogap defined by a plurality of electrodes, said electrodes being situated on a front side of the support membrane.

In other aspects, the present invention provides methods for fabricating back side-structures onto a back side of a support membrane, comprising: providing a support membrane comprising a front side and a back side, said front side comprising two proximate electrodes that define a nanogap; controllably depositing vaporized material to the back side of the support membrane; and contacting a focused ion beam to the vaporized material.

In other aspects, the present invention provides nanogap field effect transistors, comprising: a nanogap disposed between a source electrode and a drain electrode, said source and drain electrodes being disposed on a front side of said support membrane, said support membrane supported by a supporting structure adjacent to a back side of said support membrane; a local gate electrode disposed on a back side of said support membrane, said gate continuously extending along a sloped surface of the supporting structure; and one or more semiconducting nanostructures disposed within said nanogap.

In other aspects, the present invention provides devices, comprising: a nanogap defined by two proximate electrodes adjacently disposed on a front side of a support membrane and a third electrode adjacently disposed on a back side of the support membrane.

In other aspects, the present invention provides devices, comprising: a plurality of uncoupled nanogap field effect transistors disposed in an array, each nanogap field effect transistor individually comprising source and drain electrodes forming a nanogap therebetween, a nanostructure disposed within each nanogap, the source and drain electrodes separated from individual local gate electrodes by a common insulating support membrane.

In other aspects, the present invention provides devices, comprising: a plurality of coupled nanogap field effect transistors disposed in an array, each nanogap field effect transistor comprising source and drain electrodes forming a nanogap therebetween, a nanostructure disposed within each nanogap, the source and drain electrodes separated from individual local gate electrodes by a common insulating support membrane.

In other aspects, the present invention provides detectors, comprising: two proximately spaced electrodes disposed on a support membrane, the space between the electrodes defining a nanogap having a width in the range of from about 1 nm to about 50 nm, a voltage source electrically connected to one of the electrodes; and a current measuring device electrically connected to the other electrode and to electrical ground for measuring a tunneling current that varies with the nanogap width.

In other aspects, the present invention provides methods of storing and reading information in a digital memory element, comprising: providing a digital memory element, comprising: two proximately spaced electrodes disposed on a support membrane, the space between the electrodes defining a nanogap having a width in the range of from about 1 nm to about 50 nm, a voltage source electrically connected to one of the electrodes; and a current measuring device electrically connected to the other electrode and to electrical ground for measuring a tunneling current that varies with the nanogap width; characterizing the digital memory element as having a zero state when the nanostructure is charge neutral and the voltage source is electrically connected to the source electrode is at the same voltage value as the ground, and substantially no current is measured by the current meter; changing the state of the device by applying a first voltage to the nanostructure, optionally measuring the current using the current measuring device as the voltage source is activated; characterizing the digital memory element as having a one state when the nanostructure possesses a net charge, optionally changing the state of the device back to the zero state by either applying a voltage of opposite polarity to that of the first voltage, or by exposing the device to light; and optionally determining the state of the device by measuring its conductivity wherein a zero state corresponds to a high conductivity and a one state corresponds to a low conductivity.

In other aspects, the present invention provides devices, comprising: a support membrane comprising a nanogap, the nanogap defined by the proximity of a source electrode, a drain electrode and a local gate electrode disposed together on the same side of the support membrane; a plurality of coupled nanostructures disposed within the nanogap; wherein the local gate electrode is situated so as to be able to tune the coupling between the plurality of nanostructures.

In other aspects, the present invention provides devices, comprising: a nanogap defined by two or more proximate electrodes disposed on a front side of a support membrane; a looped conductive-wire backstructure disposed on a back side of the support membrane and at least partially encircling a region opposite the nanogap, the looped conductive-wire backstructure electrically connected on one end to a voltage source and to electrical ground on the other end, the looped conductive-wire backstructure capable of applying magnetic fields to one or more nanostructures residing inside or proximate to the nanogap.

In other aspects, the present invention provides methods of controlling the spin in nanostructures, comprising, providing a device, comprising: a nanogap defined by two or more proximate electrodes disposed on a front side of a support membrane; a looped conductive-wire backstructure disposed on a back side of the support membrane and at least partially encircling a region opposite the nanogap, the looped conductive-wire backstructure electrically connected on one end to a voltage source and to electrical ground on the other end, the looped conductive-wire backstructure capable of applying magnetic fields to one or more nanostructures residing inside or proximate to the nanogap; applying a voltage with the voltage source to drive current through the looped conductive-wire backstructure; creating a magnetic field by acceleration of electric current through the looped conductive-wire backstructure; and controlling the voltage to control the spin of structures disposed within the nanogap.

In other aspects, the present invention provides methods of making a nanogap, comprising: providing a support membrane mask comprising a support membrane, a plurality of openings disposed within said support membrane, and at least one support membrane nanofeature disposed between at least two of the openings; positioning the support membrane mask proximate to a substrate surface; and depositing chemical vapor through said at least two of the openings to give rise to at least two chemical vapor deposited structures disposed on the substrate surface, at least two of the chemical vapor deposited structures forming a nanogap therebetween.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 22a-d are schematic illustrations of various embodiments of the present invention.

DETAILED DESCRIPTION OF ILLUSTRATIVE EMBODIMENTS

Figure 1:
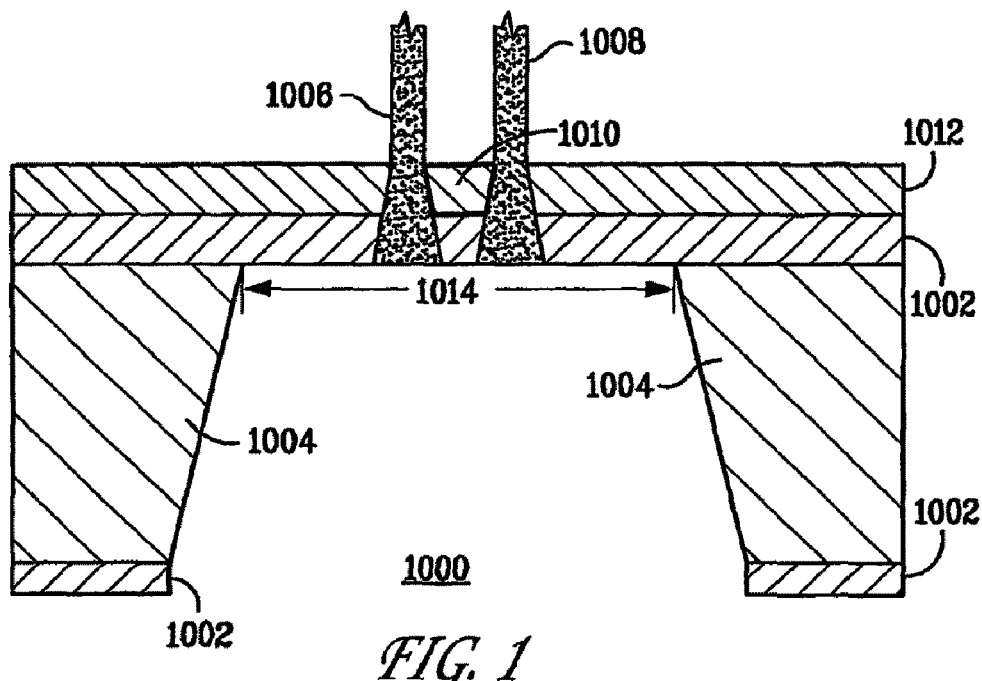
FIG. 1 is a schematic illustration of an imaging step (lithographic writing step) in an embodiment of the nanogap fabrication process of the present invention.

The present invention may be understood more readily by reference to the following detailed description taken in connection with the accompanying figures and examples, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

As employed above and throughout the disclosure, the following terms, unless otherwise indicated, shall be understood to have the following meanings.

"Wafer" refers to a flat substrate material, typically composed of silicon, that optionally has various different coatings and materials deposited on its surface.

"Nanoscale" refers generally to dimensions in the range of from about 0.1 nanometer ("nm") up to about 100 nm.

"Nanoscale feature" refers generally to an object that has nanoscale dimensions.

"Layer" refers to a thin material that typically surmounts another material or object.

"Support membrane" refers generally to a thin material that is physically supported by an adjacent stronger material; "support membrane"and "thin layer support membrane" are generally synonymous as used herein.

"Adhering" refers to one or more processes involved in causing two or more materials to remain adjacent (e.g., "stick to") one another. Adhering may include the formation of covalent bonds, electrostatic bonds, ionic bonds, dispersive bonds, magnetic bonds, material entanglement, physical interlocking, or any combination thereof.

"Plurality" means more than one.

As used herein the terms "top" and "bottom" are relative to one another and do not necessarily indicate one or more orientations with respect to the earth.

In various embodiments nanogaps are formed using any of a variety of thin film support membranes. Suitable support membranes include any of a variety of thin film materials that are typically used in the field of semiconductor and photonic devices. Preferred thin film materials include silicon nitride, low-stress silicon nitride, silicon oxide, and gallium arsenide. Window grids for use in transmission electron microscopy (TEM) can be suitably used as support membranes, such as those commercially available from SPI Supplies, Inc., West Chester, Pa. (http://www.2spi.comicatalog/instruments/silicon-nitride.shtml). A suitable method of forming a variety of support membranes is generally described in FIGS. 29a-f. Support membranes can be provided using CVD or any suitable thin film deposition processes known in the art. Accordingly, many different types of support membrane compositions and geometries are possible. For example, any of the below listed compounds and compositions, and combinations thereof, can be prepared into support membranes using methods know in the art: low stress silicon nitride, gallium nitride, amorphous carbon, indium arsenide, aluminum oxide, Aeschynite (Rare Earth Yttrium Titanium Niobium Oxide Hydroxide), Anatase (Titanium Oxide), Bindheimite (Lead Antimony Oxide Hydroxide), Bixbyite (Manganese Iron Oxide), Brookite (Titanium Oxide), Chrysoberyl (Beryllium Aluminum Oxide), Columbite (Iron Manganese Niobium Tantalum Oxide), Corundum (Aluminum Oxide), Cuprite (Copper Oxide), Euxenite (Rare Earth Yttrium Niobium Tantalum Titanium Oxide), Fergusonite (Rare Earth Iron Titanium Oxide), Hausmannite (Manganese Oxide), Hematite (Iron Oxide), Ice (Hydrogen Oxide), Ilmenite (Iron Titanium Oxide), Perovskite (Calcium Titanium Oxide), Periclase (Magnesium Oxide), Polycrase (Rare Earth Yttrium Titanium Niobium Tantalum Oxide), Pseudobrookite (Iron Titanium Oxide), members of the Pyrochlore Group, such as Betafite (Rare Earths Calcium Sodium Uranium Titanium Niobium Tantalum Oxide Hydroxide), Microlite (Calcium Sodium Tantalum Oxide Hydroxide Fluoride), Pyrochlore (Sodium Calcium Niobium Oxide Hydroxide Fluoride,) Ramsdellite (Manganese Oxide), Romanechite (Hydrated Barium Manganese Oxide), members of the Rutile Group, such as Cassiterite (Tin Oxide), Plattnerite (Lead Oxide), Pyrolusite (Manganese Oxide), Rutile (Titanium Oxide), Stishovite (Silicon Oxide), Samarskite-(Y) (Rare Earth Yttrium Iron Titanium Oxide), Senarmontite (Antimony Oxide), and members of the Spinel Group, such as Chromite (Iron Chromium Oxide), Franidinite (Zinc Manganese Iron Oxide), Gahnite (Zinc Aluminum Oxide), Magnesiochromite (Magnesium Chromium Oxide), Magnetite (Iron Oxide), Spinel (Magnesium Aluminum Oxide), Taaffeite (Beryllium Magnesium Aluminum Oxide), Tantalite (Iron Manganese Tantalum Niobium Oxide), Tapiolite (Iron Manganese Tantalum Niobium Oxide), Uraninite (Uranium Oxide), Valentinite (Antimony Oxide, Zincite (Zinc Manganese Oxide), or any combination thereof. In preferred embodiments, the support membranes are suitably chosen from low-stress silicon nitride.

The thin film materials that give rise to suitable support membranes are preferably supplied as thin films on one or both sides of a silicon support wafer. Preferably the support membrane is highly polished, such that the surface roughness is less than about 10 nm per square micron. Thin film deposited silicon support wafers are subsequently processed to remove portions of the silicon support to yield silicon-supported thin films. Thin film etching can also be carried out to control the thickness of the resulting thin film support membrane.

Suitable support membranes typically have a thickness in the range of from about 10 nm to about 1000 nm and can be unsupported, but are preferably supported on a substrate such as silicon. Suitable support membranes supported on a substrate form a free-standing support membrane window. Free-standing support membrane windows that can be suitably used in various embodiments of the present invention typically have an area in the range of from about $10^{-1}$ square microns to about $10^5$ square microns. There is nothing in principle that prevents the window from being arbitrarily small or large, so any size is possible, from about 100 square nanometers up to about 1 square millimeter. The free-standing support membrane window can have almost any shape, such as a circle, square, rectangle, triangle, or other polygon having 4 or more sides. Further information about preparing support membranes can be found in Grant, A. W., et al., *Nanotechnol.* 2004, 15, 1175; Morkved, T. L., et al., *Polymer* Vol. 39 No. 16 pp. 3871-3875, 1998; and Pandey, R. K., et al. *J. Opt. Mat.* 2004, 27, 139. A plurality of support membranes can also be provided on wafers.

During fabrication of the nanogaps, the support membrane can, in some embodiments, be surmounted by an imageable layer on one or both sides of the support membrane. Suitable imaging materials include particle- and photon-reactive compositions, such as photoresists that well known in the semiconductor processing industry. Suitable photoresists include acrylic polymers, many of which are commercially available from the Rohm and Haas Company (Shipley Company Division), Marlboro, Mass., examples include: i-Line Photoresists, 248 nm (DUV) Photoresists, 248 nm (DUV) Anti-Reflectants, 193 nm Photoresists, 193 nm Anti-Reflectants, 3612 photoresist, 1813 photoresist, Ultra-i 120, NR7. Sumitomo also provides PFI88A3 photoresist. A comprehensive photoresist list can be found on-line at http://cmi.epfl.ch/materials/Photosensitive.htm.

TABLE 1

Materials for photolithography

| Resist family | Product | Remarks |
| --- | --- | --- |
| S1800 series resist (Rohm and Haas) | S1805 | CMOS process, low topography 0.5 µm to 1.0 µm |
|  | S1813 | Standard robust process 1.1 µm to 2.0 µm |
|  | S1818 | Standard robust process 2.0 µm to 3.5 µm |
| Image reversal resist (microchemicals GmbH) AZ9200 series (Clariant) | TI35ES | Image reversal resist for lift-off. Thickness 1.8 µm to 6 µm |
|  | AZ9200 Thick Resist | Thick resist coating with vertical walls. Single-layer: AZ9260 5 µm to 14 µm Multi-layer: AZ9260 30 to 70 um |
|  | Dil. AZ92xx | Wall profile controlled for DRIE soft-masks |
|  | Dil. AZ9260 Spray coating | Spray coating for critical high aspect ration topography and/or special shaped samples. |
| Lift-off resist LOR (MicroChem) Associated with S1800 or TI | LOR5A | Sacrificial layer T profile lift-off. Thickness 0.4 µm to 1 µm: Standard double layer lift-off: S1813 on LOR |

TABLE 2

Polyimide and epoxy based resists

| Resist family | Product | Remarks |
|---|---|---|
| SU8 from Gerstel | GM 1040 | Thickness 1 μm to 10 μm |
| | GM 1060 | Thickness 10 μm to 50 μm |
| | GM 1070 | Thickness 50 μm to 500 μm |
| SU8 from MicroChem | SU8-2007 | Thickness 4 μm to 8 μm |
| | SU8-2015 | Thickness 15 μm to 40 μm |
| | SU8-2035 | Thickness 40 μm to 120 μm |
| | SU8-50 | Thickness 40 μm to 200 μm |
| Polyimide 2600 series | PI-2610 | Thickness 1.5 μm to 3 μm (non photodefinable) |
| Dry etch, Low stress, Low K | PI-2611 | Thickness 4 μm to 8 μm (non photodefinable) |
| Polyimide 2720 series Fine Line | PI-2727 | Thickness 4 μm to 7 μm |
| Polyimide 2730 series Low stress | PI-2731 | Thickness 6 μm to 12 μm |

Photolithography processes for preparing microelectronics can be suitably used in the various embodiments of the present invention. Photolithographic technologies known to those of skill in the art are described in Mei, L. (Vitelic Co., San Jose, Calif., USA) Source: *Microlithography: High Integration in Microelectronics. Proceedings of the First Workshop*, 1990, p 77-93, ISBN: 981 02 0137 0, Conference: Microlithography: High Integration in Microelectronics. Proceedings of the First Workshop, 28 Aug.-1 Sep. 1989, Rio de Janeiro, Brazil, Publisher: World Scientific, Singapore.

Suitable photoresists are further described in "Materials and processes at the leading edge of photolithography", Taylor, G. N. (AT&T Bell Labs., Murray Hill, N.J., USA), Source: *Electronic Packaging Materials Science Symposium*, 1988, p 257-74; ISBN: 0 931837 76 6; Conference: Electronic Packaging Materials Science Symposium, 30 Nov.-4 Dec. 1987, Boston, Mass., USA, Sponsor: Mater. Res. Soc. Publisher: Mater. Res. Soc, Pittsburgh, Pa., USA. In one embodiment, suitable acrylic polymer photoresists comprise a polymer having a weight average molecular weight in the range of from about 500 g/mol to about 50,000 g/mol.

The imageable layer can be surmounted to the support membrane using a suitable coating step to coat the imageable layer to one or both sides of the support membrane. Suitable coating processes include spin coating, dip coating, ink jet coating, doctor blade coating, microgravure coating, vapor deposition, drop casting, and the like, or any combination thereof. Among these, the preferred coating steps include spin coating, vapor deposition, or any combination thereof. The support membrane can be surmounted by the imageable layer on one or both sides of the support membrane. Typically, the support membrane is unsupported on one side and the imageable layer is surmounted on the unsupported side of the support membrane. After the imageable layer is coated and dried, the deposited imageable layer typically has a thickness in the range of from about 10 nm to about 10,000 nm. Further details about coating and processing photoresists can be found in the references as described herein and known to those of ordinary skill in the art. See, for example, http://mail.mems-exchange.org/pipermail/mems-talk/1997-September/001056.html.

Photoresists are typically imageable layers that are formulated using volatile solvents to control viscosity profile, and hence film thickness. Accordingly, one or more volatile components are typically removed from the imageable layer prior to imaging. In addition to the solvent, photoresists can also contain a variety of small, volatile molecules that are desirably removed prior to imaging. Typical volatile components include solvents, diluents, oligomers, polymer fragments, or any combination thereof.

The imageable layer is imaged using a suitable imaging source to give rise to one or more desired nanoscale features composed of a portion of the imageable layer surmounting one or both sides of the support membrane. In several embodiments, the step of imaging includes exposing the imageable layer to particles (typically under vacuum) or photons of a sufficient energy to break or form bonds in the imageable layers. Preferably, the step of imaging exposes at least a portion of the imageable layer to electrons with energies sufficient to break covalent bonds in the imageable layer. The imaged portions are typically removed in a subsequent step, such as by washing or developing. Further details about imaging photoresists can be found in "Materials and processes at the leading edge of photolithography" by G. N. Taylor, id., as well as in "Overview of greyscale photolithography for microoptical elements fabrication", Cui, Z. et al., Source: *Proceedings of the SPIE—The International Society for Optical Engineering*, v 4984, 2003, p 111-17, "Computer simulation of positive-resist photolithography", Kol'tsov, Yu. I. (*Russian Res. Inst. of Microelectron. Technol.*, Moscow, Russia); Smolyanitskii, I. Ya.; Tsygankov, V. Yu. Source: *Mikroelektronika*, v 24, n 1, January-February 1995, p 52-62; "Materials and processes in microlithography for IC fabrication", Teng, C-H, et al. (Mater. Res. Labs., hid. Technol. Res. Inst., Hsinchu, Taiwan); Source: *MRL Bulletin of Research and Development*, v 4, n 2, September 1990, p 1-7; and on the Internet at http://wwvv.ece.gatech.edu/research/labs/vc/processes/photoLith.html.

Suitable imaging sources include collimated particle sources, such as electron beams used in electron-beam lithography ("EBL"), which are preferred over photon sources, such as X-rays and ultraviolet light. Other imaging sources includes an atom sources (atom beam lithography) as well as ion sources (focused ion beam lithography). Suitable imaging sources are capable of imaging the imageable layer with a resolution in the range of from about 10 nm to about 100 nm. For example, Focused Ion Beam (FIB) uses a narrow stream of high energy charged atoms. The energies of the ions in the beam can be made sufficient to image the imageable layer and can therefore be used, at least in principle, instead of an electron beam. Further details about atom lithography can be found on the internet at http://physicsweb.org/articles/news/6/10/2/1, for example by exposing a silicon substrate to a beam of "metastable" argon atoms. Without being bound by a particular theory of operation, it is believed that metastable atoms exist in a naturally excited state and release their energy when they strike the substrate. A layer of hydrocarbons that resides on the substrate functions as the resist by adhering more strongly to the substrate when energized. To create a pattern in the atom beam, a mask made of laser light can be used. Argon atoms resonant with the light are excited into an even higher state, and fall back down to the ground state almost instantaneously, depriving the resist of energy at the points below the mask. The mask can be made in a variety of ways, with or without light beams. Additional references about atom lithography include "Formation and Detection of Atomic Wavepackets Localized to the Heisenberg Uncertainty Limit: A new Nanolithographic Technique", K. S. Johnson, J. H. Thywissen, N. H. Dekker, K. K. Berggren. A. P. Chu, R. Younkin, M. Prentiss, *Science* 280, 1583 (1998), "Demonstration of a Nanolithographic Technique Using a Self-Assembled Monolayer Resist for Neutral Atomic Cesium", K. K. Berggren, R. Younkin, E. Cheung, M. Prentiss, A. Black, G. M. Whitesides, D. C. Ralph, C. T. Black, M.

Tinkham, *Advanced Materials* 9, 52-55 (1997), "Nanolithography with metastable neon atoms: Enhanced rate of contamination resist formation for nanostructure fabrication", S. J. Rehse, A. D. Glueck, S. A. Lee, A. B. Goulakov, C. S. Menoni, D. C. Ralph, K. S. Johnson, and M. Prentiss, *Appl. Phys. Lett.* 71, 1427 (1997), "Nanostructure fabrication in silicon using cesium to pattern a self-assembled monolayer, R. Younkin, K. K. Berggren, K. S. Johnson, M. Prentiss, D. C. Ralph, G. M. Whitesides, *Applied Physics Letters* 71, 1261 (1997).

After the imageable layer is exposed, the imaging step typically further includes the step of removing at least a portion of the exposed imageable layer. The exposed imageable layer is readily removed by washing away at least a portion of the exposed imageable layer. The resulting imageable layer that remains on the support membrane after the exposed regions have been removed comprises one or more nanoscale features that are characterized as having a dimension in the range of from about 1 nm to about 100 nm, with various embodiments having dimensions up to about 50 nm, or up to about 40 nm, or up to about 30 nm, or up to about 20 nm, or up to about 15 nm, or up to about 12 nm, or up to about 10 nm, or up to about 8 um or up to about 6 nm, or up to about 4 nm, or up to about 3 nm, or even up to about 2 nm. Typically, this dimension is measured in a direction parallel to the surface of the support membrane, for example, wherein the dimension is the width of the nanoscale feature. Further details concerning imaging and removal of photoresists can be found in G. N. Taylor 1988, cited above., Z. Cui 2003, cited above, and other references cited above.

An optional adhesive layer can be formed on at least one side of the support membrane comprising the nanoscale features. This layer helps to facilitate the bonding of the further material to the support membrane. Adhesive materials include: chromium, titanium, aluminum, platinum, niobium. Adhesive materials are usually: chromium, titanium, and preferably nickel. In some embodiments the thickness of the optional adhesive layer need only be about 1 nm but in other embodiments adhesive layer thicknesses of up to about 100 nm can be used, depending on the ultimate thickness of the feature being fabricated.

One or more layers of one or more further materials surmounted on at least a portion of the nanoscale features, the support membrane, the optional adhesive layer, or any combination thereof, is then formed. Suitable further materials include any type of compositions of matter that are suitably processed using any of a variety of vapor-based and liquid-based chemical processes. Preferred compositions of matter that are suitably used as further materials for surmounting on at least a portion of the nanoscale features can be lifted off the imageable layer in a washing step, and which remain adhered to the support membrane or adhesive layer. Suitable further materials include, in some embodiments, conductive metals, such as gold, silver, platinum, copper, chromium, titanium, aluminum, niobium, or any combination thereof. The further materials, especially metals, can be applied using CVD, MBE, sputtering, or any combination thereof. CVD is preferred. Suitable thicknesses of the further materials for deposition range from a single atomic or molecular layer (using MBE) to arbitrarily thick layers. The further materials are preferably between one and ten nanometers thick. Further details about these methods can be generally found in the references as cited herein.

Any of a variety of semiconductor materials can also be applied on at least a portion of the nanoscale features and the support membrane for providing nanogaps residing between semiconductor structures. For example, suitable semiconductor materials include epitaxially grown II-VI and BIN semiconductor layers. Other suitable semiconductor materials are further described hereinabove. Insulator materials can be deposited on the nanoscale features and support membrane. For example, suitable insulators include silicon nitride, silicon oxide, as well as any of the materials described hereinabove that are suitable for forming support membranes.

At least a portion of the one or more layers of one or more further materials surmounted on at least a portion of the nanoscale features is removed to give rise to one or more nanogaps residing proximate to one or more layers of one or more further materials surmounted on the support membrane, the optional adhesive layer, or any combination thereof. The portion of the further materials that are removed typically adheres to the surface of the remaining imageable layer. Accordingly, the further materials are typically removed by washing away the remaining imageable layer using a suitable solvent. For example, removing the nanoscale features from the support membrane together with the further material adhering to the nanofeature to give rise to the nanogap (i.e. "lift off") can be achieved by dissolving/removing the imageable layer on top of which the unwanted deposited material (i.e., further material) rests. This can be accomplished by putting the device (which at this point has the further material on it) into a suitable solvent (e.g., acetone) for dissolving the imageable layer and then waiting for the imageable layer to dissolve (e.g., ca. 30 minutes). Consequently, the unwanted further material is removed. Suitable conditions include soaking in a suitable solvent for some time, for example, less than about one hour, less than out four hours, less than about eight hours, less than about 12 hours, or even for 12 or more hours (i.e., overnight). Combinations of two or more solvents, such as methylene chloride and acetone, can also be used. Typical ratios are between 1:1 and 9:1 (methylene chloride:acetone). The temperature of the solvent can be room temperature or above room temperature. It may be more rapid to heat the solvent to a temperature as high as its boiling point. Instead of or in addition to heating, the dissolving liquid can be stirred (e.g., with a stir bar). Sonication can be used, but the membrane may break. However, because it is possible to deposit material onto the back of the membrane (after depositing material onto the lithography side, but before doing the lift off) the membrane may be made to withstand sonication with support from this additional material. In preferred embodiments, the imageable material that gives rise to the formation of the nanogap is typically removed at the same time as the remaining unwanted material is removed. After the main lift off is accomplished, it may be useful to flow additional dissolving liquid, or some other substance such as a high pressure gas, or both, across the surface of the membrane to remove additional unwanted material. After lift off, the resulting nanogap device can be cleaned with a suitable cleaning solvent, such as an alcohol (e.g., isopropyl alcohol), deionized water, or any combination thereof. The resulting nanogap device can also be exposed to oxygen plasma to eliminate residual organic matter from the surface of the device.

At least a portion of the further materials that are removed forms the nanogap, which resides adjacent to further material that adheres directly to, or via an optional adhesive layer, the support membrane. A suitable nanogap is characterized as having a dimension in the range of from about 1 nm to about 100 nm, with various embodiments having dimensions up to about 50 nm, or up to about 40 nm, or up to about 30 nm, or up to about 20 nm, or up to about 15 nm, or up to about 12 nm, or up to about 10 nm, or up to about 8 nm or up to about 6 nm, or up to about 4 nm, or up to about 3 nm, or even up to about 2 nm. Typically, this dimension is measured in a direction parallel to the surface of the support membrane, for example, wherein the dimension is the width of the nanoscale feature.

In another embodiment of the present invention, the methods described hereinabove for fabricating nanogaps can further comprise one or more additional device fabrication steps. The additional device fabrication steps can be performed before, during, or after the one or more nanogaps are formed. These additional steps can be performed on a side of the support membrane comprising the one or more nanogaps, or on a side of the support membrane opposed to the side of the support membrane comprising the one or more nanogaps, or both. Additional types of device fabrication steps can generally be found in Madou, M. J., "Fundamentals of Microfabrication: The Science of Miniaturization" (Second Edition), CRC Press, 2002. The principles described in this reference can be suitably practiced by one of ordinary skill in the art, in combination with this disclosure, to make semiconductor devices that include one of more nanogaps.

In another embodiment of the present invention, the methods described hereinabove for fabricating nanogaps can further comprise the step of providing one or more nanostructures within at least a portion of the one or more nanogaps, or within each of the one or more nanogaps. In these embodiments, at least a portion of the one or more nanostructures are deposited into the nanogaps. This can be advantageously used, for example, for depositing semiconducting nanocrystals in the nanogaps for making nanogap field effect devices. In other embodiments, at least a portion of the one or more nanostructures are synthesized within the nanogaps. For example, a carbon nanotube catalytic growth site can be deposited in the nanogap and then a single wall carbon nanotube can be grown from the nanogap. In these embodiments, the one or more nanostructures are electronically or photonically coupled to the support membrane, the optional adhesive layer, the further material, or any combination thereof. This is useful in preparing electronic and photonic devices.

In other embodiments of the present invention, there are also provided methods for creating small nanofeatures in support membranes. These methods include providing a support membrane surmounted by an imageable layer on one or both sides of the support membrane; imaging the imageable layer to give rise to one or more desired nanoscale features composed of a portion of the imageable layer surmounted on one or both sides of the support membrane; and etching a portion of the support membrane residing proximate to the one or more desired nanoscale features to give rise to a support membrane nanofeature composed of a portion of the support membrane. In additional related embodiments, these methods can further include the step of removing the one or more desired nanoscale features composed of a portion of the imageable layer. Useful devices can be made according these methods, such as masks for producing nanogaps as described further herein.

FIG. 1 is a schematic illustration of a suitable lithographic writing step used in the imaging step of an embodiment of the nanogap fabrication process of the present invention. A suitable substrate used in the nanogap fabrication process is shown as including an imageable layer, such as a thin resistive layer, e.g., a photoresist, (1012) which resides adjacently to the support membrane (1002). The support membrane sits on the top surface of a supporting layer (1004). A section of the supporting layer is removed during an earlier processing step so as to define an area (1014) where the support membrane is freely supported. A first exposure beam (1006) and a second exposure beam (1008) are used to expose two closely spaced regions within the area of the imageable layer that resides adjacently to the freely supported portion of the support membrane (1014). Additional exposure beams can be used for creating additional patterns in the section of the imageable layer in between the two exposed regions (1010) is not exposed.

Figure 2:
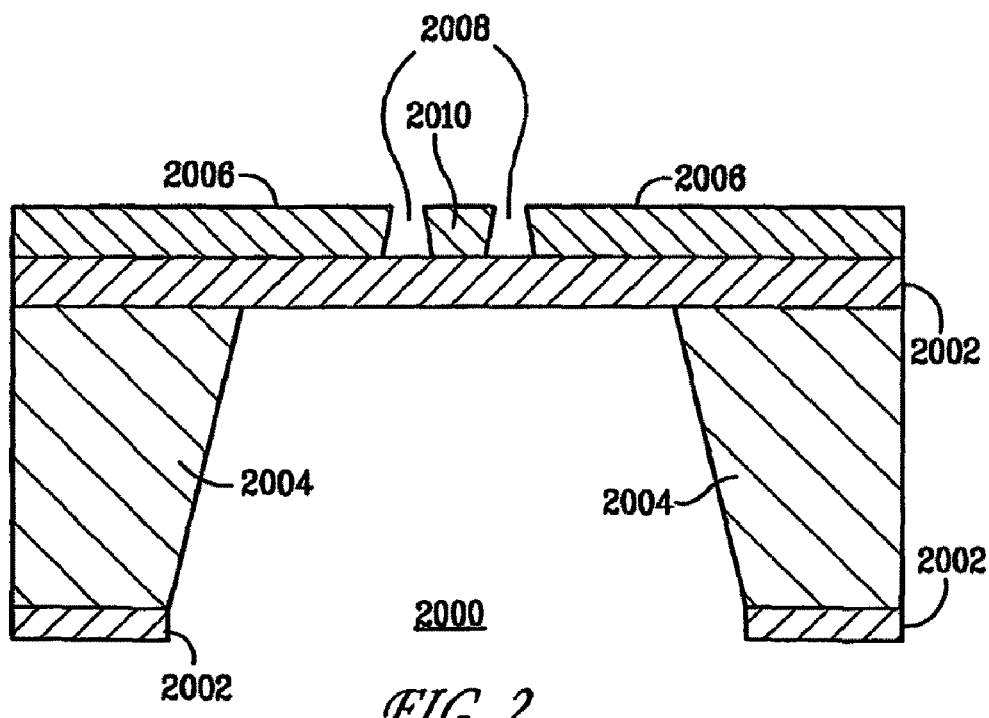
FIG. 2 is a schematic illustration of an embodiment of the structure in FIG. 1 after a portion of the imageable layer is removed to provide nanoscale features.

FIG. 2 is a schematic illustration of an embodiment of the structure in FIG. 1 after being developed. The two closely spaced regions of the imageable layer that were exposed to the two exposure beams are now absent (2008). The section of imageable layer between the two closely spaced exposed regions (2010) remains. Likewise, all other regions of the imageable layer not exposed to the exposure beams (2006) remain. The support membrane (2002) and supporting layer (2004) remain essentially unchanged in this embodiment.

Figure 3:
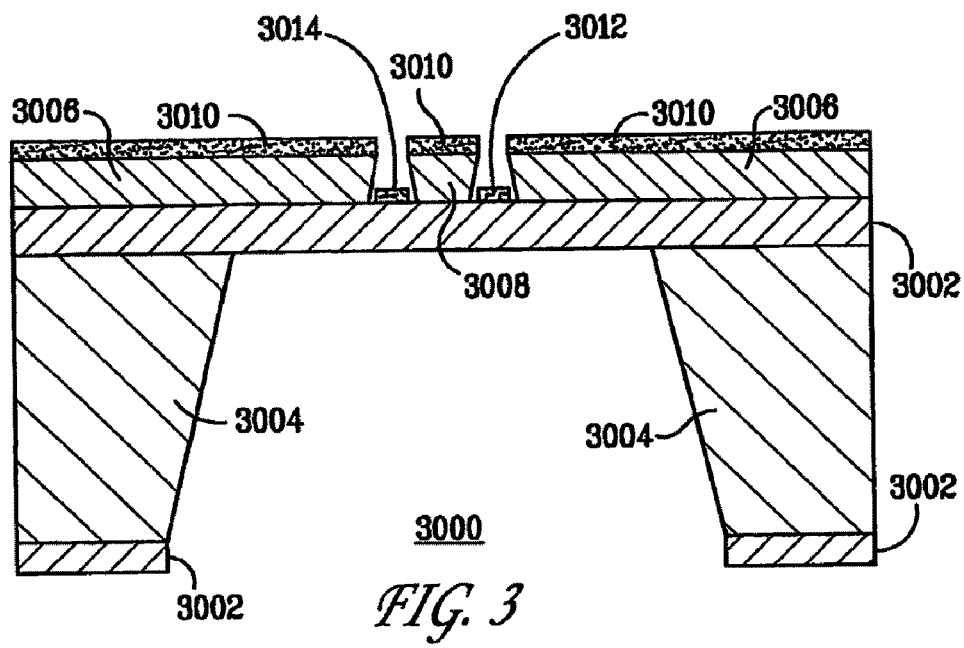
FIG. 3 is a schematic illustration of an embodiment of the structure in FIG. 2 after further material has been adhered to a support membrane to cover at least a portion of the nanoscale features.

FIG. 3 is a schematic illustration of an embodiment of the structure in FIG. 2 after further material has been deposited onto the developed imageable layer. Further material (3010) is deposited onto the surface of the regions of the imageable layer (3006) and (3008) which were not removed during development. Further material (3014) and (3012) is also deposited onto the support membrane (3002) in the two areas that were revealed by the removal of exposed imageable layer during development. The support layer (3004) is essentially unchanged in this embodiment.

Figure 4:
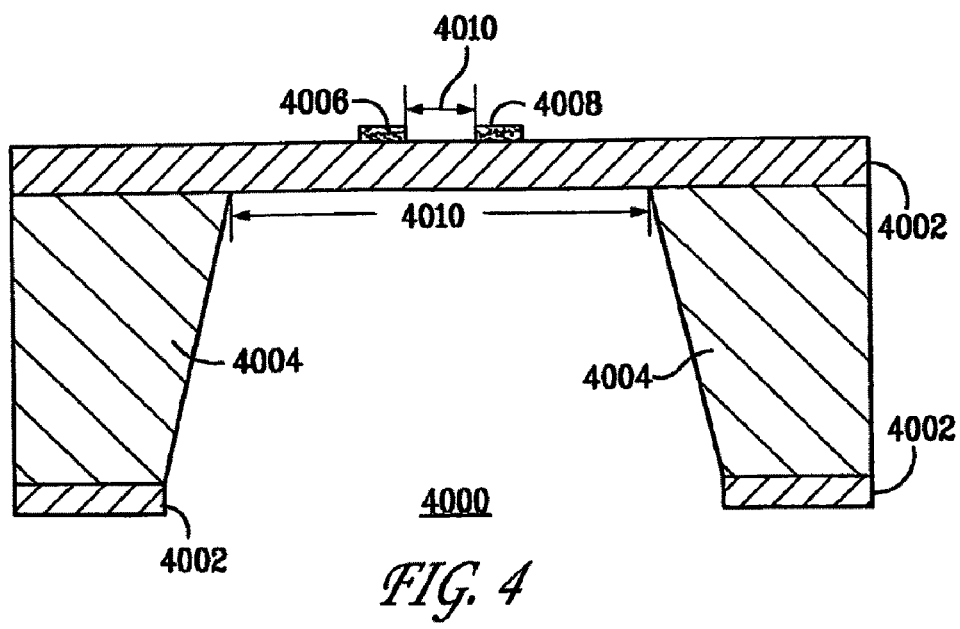
FIG. 4 is a schematic illustration of an embodiment of the structure in FIG. 3 after removing the nanoscale features from the support membrane together with the further material adhering to the nanofeature to give rise to a nanogap.

FIG. 4 is a schematic illustration of an embodiment of the device in FIG. 3 after the lift-off step. Two features (4006) and (4008) composed of the further material deposited in the prior step are situated proximately and define a nanogap (4010). The nanogap is situated over the region (4010) where the support membrane (4002) is freely supported. The supported portion of the support membrane is supported by the supporting layer (4004).

Figure 5:
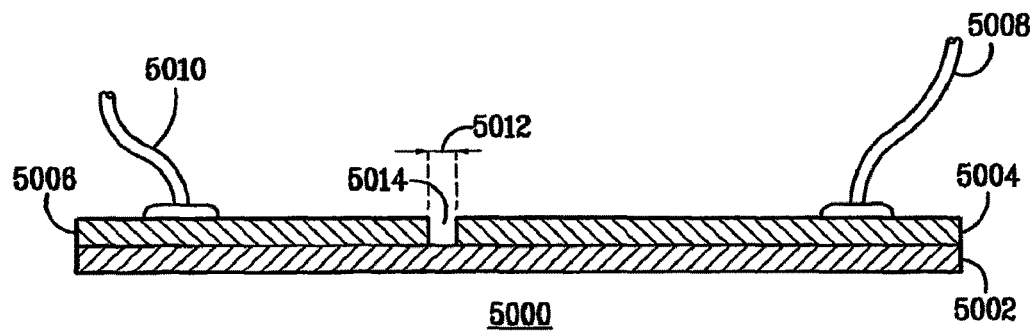
FIG. 5 is a schematic illustration of a side view of an embodiment of an electronic nanogap device of the present invention.

FIG. 5 is a schematic illustration of a side view of an embodiment of an electronic nanogap device. Metal is used as the deposited further material. The two features that are composed of the metal are electrodes. There is a source electrode (5006) and a drain electrode (5004). These two electrodes are situated proximate to support membrane (5002). The electrodes are electrically connected to conductive wires (5008) and (5010) for the purpose of connecting the electrodes to a larger apparatus (not shown). The two electrodes are spaced by a distance (5012) that is controlled during the device fabrication as described herein. The spacing (5014) between the two electrodes is a nanogap.

Figure 6:
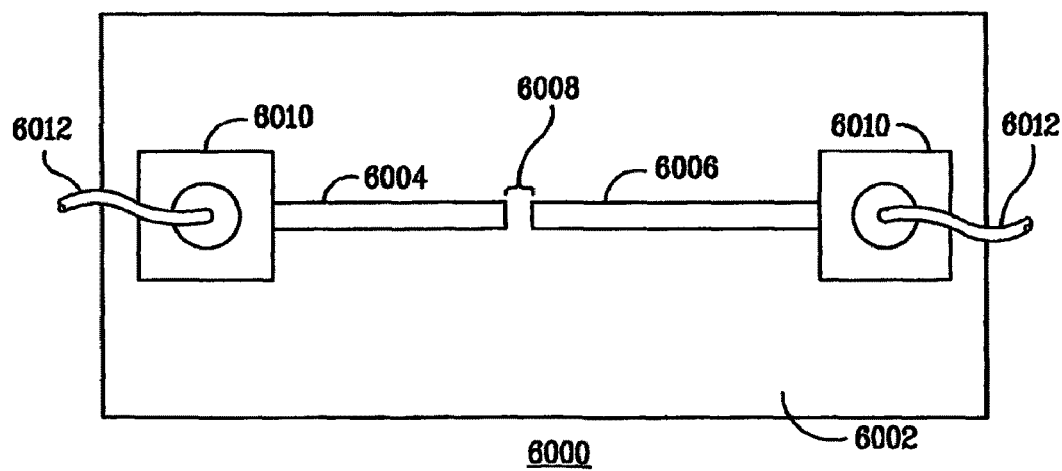
FIG. 6 is a schematic illustration of atop view of an embodiment of the electronic nanogap device depicted in FIG. 5.

FIG. 6 is a schematic illustration of the top view of an embodiment of an electronic nanogap device. The source electrode (6004) and drain electrode (6006) are situated on the thin substrate (6002) and are separated by the nanogap (6008) and are electrically connected to conductive contact pads (6010) which are electrically connected to an external apparatus (not shown) by conductive wires (6012).

Figure 7:
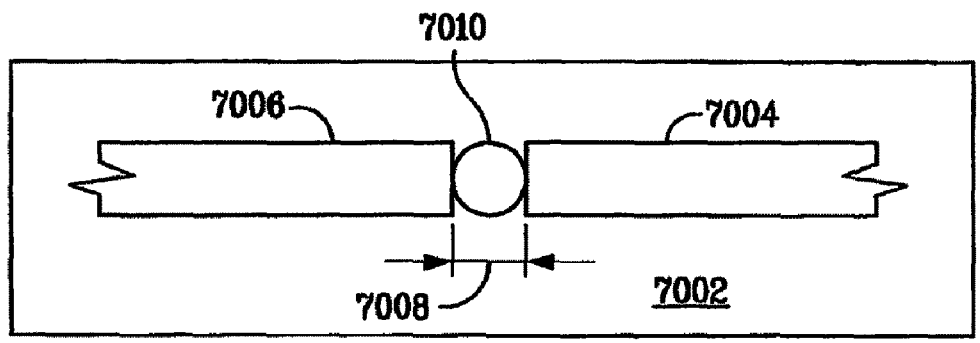
FIG. 7 is a schematic illustration of a top view of an embodiment of the present invention of an electronic device incorporating a nanogap and a nanostructure.

FIG. 7 is a schematic illustration of the top view of an embodiment of an electronic device incorporating a nanogap (7008) defined by the proximity of the source electrode (7006) and the drain electrode (7004) on a thin support membrane (7002). A nanostructure (7010) sits within the nanogap. The properties of the nanostructure determine the functionality of the full device. Devices made with this arrangement can include an electronic switch, a digital logic element, a memory element, a diode, a capacitor, a sensor, a photon source, and a photovoltaic element. Suitable nanostructures include a nanocrystal of arbitrary shape, a single molecule, a single atom, a plurality of nanostructures, or any combination thereof. Suitable nanostructures can be deposited in the nanogap by contacting a fluid comprising a nanocrystal of arbitrary shape, a single molecule, a single atom, a plurality of nanostructures, or any combination thereof, to the nanogap. Self-assembly of a suitable nanocrystal, single molecule, single atom, plurality of nanostructures, or any combination thereof in the nanogap can also occur upon contact.

Figure 8:
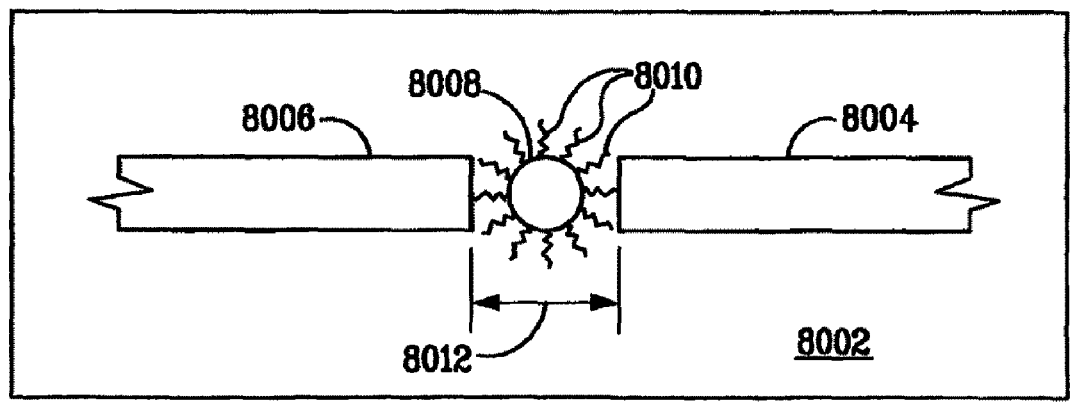
FIG. 8 is a schematic illustration of the top view of an embodiment of an electronic device incorporating a nanogap and a nanostructure with linker molecules.

FIG. 8 is a schematic illustration of the top view of an embodiment of an electronic device incorporating a nanogap (8012) defined by the proximate source electrode (8006) and drain electrode (8004) on a thin support membrane (8002). A nanostructure (8008) sits inside of the nanogap and is electronically coupled to the electrodes with linker molecules (8010). The properties of the nanostructure, the linker molecules, and their coupling to each other determine the functionality of the full device. Suitable devices made with this arrangement include an electronic switch, a digital logic element, a memory element, a diode, a capacitor, a sensor, a photon source, and a photovoltaic element. Suitable nanostructures include a nanocrystal of arbitrary shape, a single molecule, a single atom, a plurality of these structures, or any combination thereof.

Figure 9:
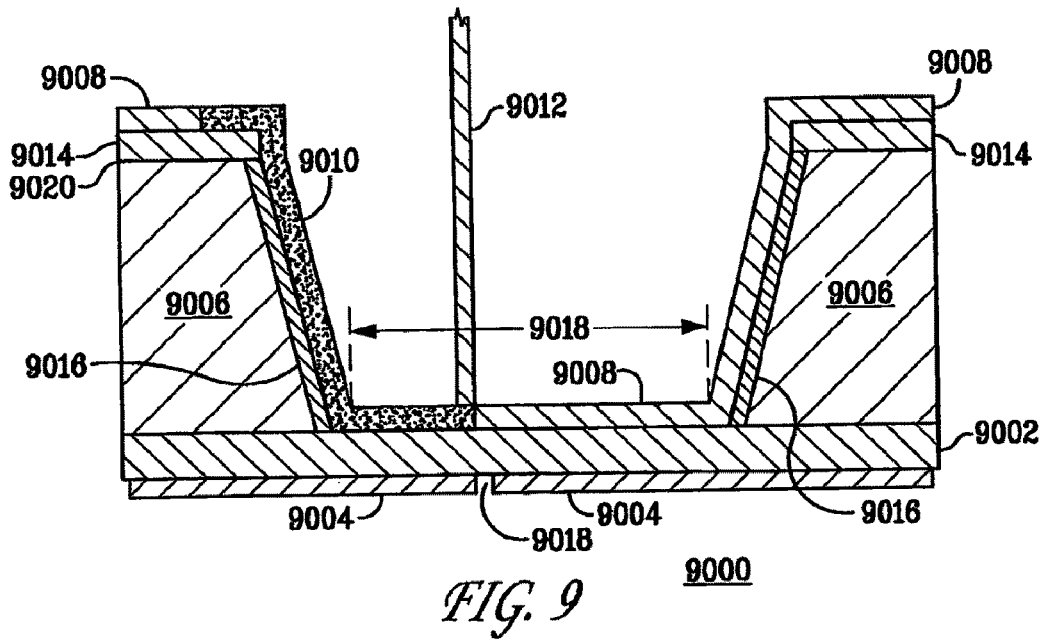
FIG. 9 is a schematic illustration of the side view of an embodiment of an electronic device of the present invention in which an electronically active element is being lithographically fabricated on the back side of a support membrane.

FIG. 9 is a schematic illustration of the side view of an embodiment of a method of preparing a device of the present invention. This figure illustrates an electronically active element being lithographically fabricated on the back side of a support membrane. A layer of imageable layer (9008) is exposed to an exposure beam (9012). The region of exposed imageable layer (9010) is continuously connected from the region of the imageable layer which is situated on an insulating layer (9014) situated on the bottom side (9020) of the supporting layer (9006), down along the sloped surface of the supporting layer which is covered with an insulating layer (9016) and onto the back-side of the freely supported region (9018) of the support membrane (9002). Electrodes (9004) defining a nanogap (9018) are on the opposite side of the support membrane (9002). The exposure beam is suitably composed of focused electrons or focused light and the imageable layer is suitably chosen according to the type of exposure beam.

Figure 10:
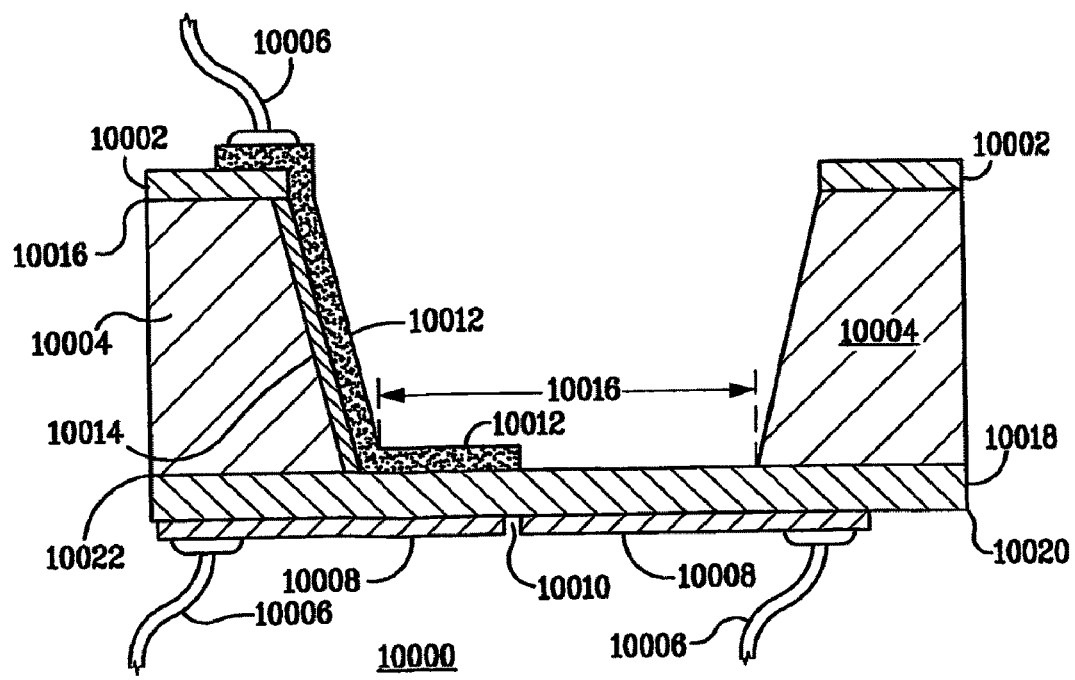
FIG. 10 is a schematic illustration of the side view of an embodiment of an electronic device in which an electronically active element has been fabricated on the back side of a support membrane.

FIG. 10 is a schematic illustration of the side view of an embodiment of an electronic device made using the process described in FIG. 9 in which an electronically active element (10012) has been fabricated on the back side (10022) of the support membrane. The back side-structure (10012) is continuously connected from the region of the support membrane (10018) which is freely supported (10016), along the sloped surface of the supporting layer (10004) which is covered with an insulating layer (10014) and onto the bottom side (10016) of the supporting layer (10004) which is covered with an insulating layer (10002). The electrically active feature (10012) is electrically connected to an external apparatus (not shown) through an electrical connection to a conductive wire (10006). A portion of the back side feature (10012) is placed opposite to a nanogap (10010). The nanogap is defined by two proximate electrodes (10008) and is situated on the front side (10020) of the supported region (10016) of the support membrane (10018).

Figure 11:
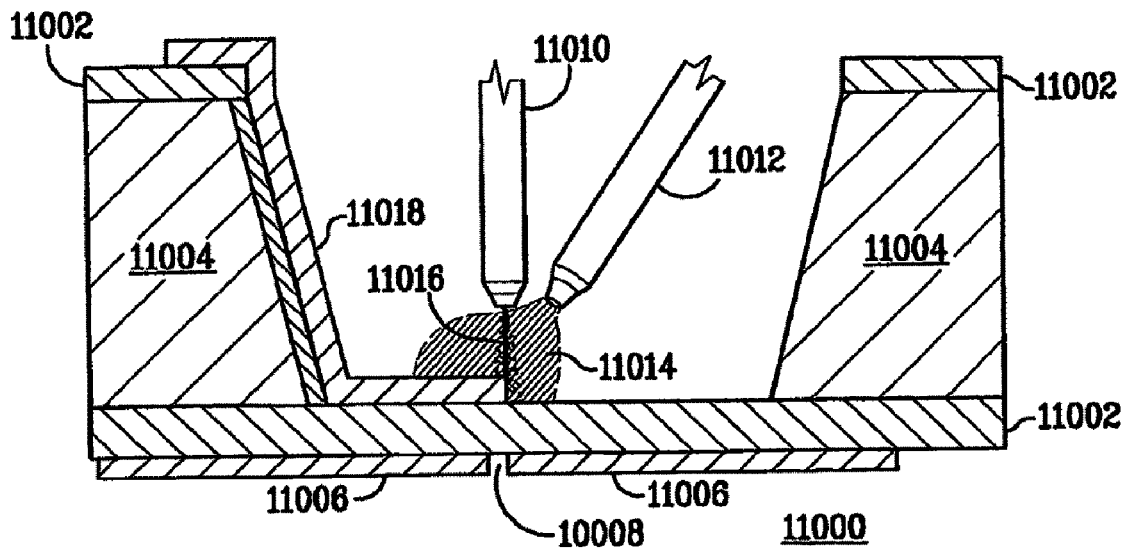
FIG. 11 is a schematic illustration of a method for fabricating back side-structures onto the side of the support membrane that is opposite to two proximate electrodes comprising a nanogap residing therebetween.

FIG. 11 is a schematic illustration of an embodiment of a method for fabricating back side-structures (11018) onto a side of a support membrane (11002) that is opposite to two proximate electrodes (11006) that define a nanogap (11008). A source (11012) of vaporized material (11014) is bombarded with a focused ion beam (11016). The position of the beam (11016) is controlled by the placement of its source (11010) and the material is deposited controllably. Structures fabricated onto the support membrane can be connected continuously along the sloped surface of the supporting layer (11004).

Figure 12:
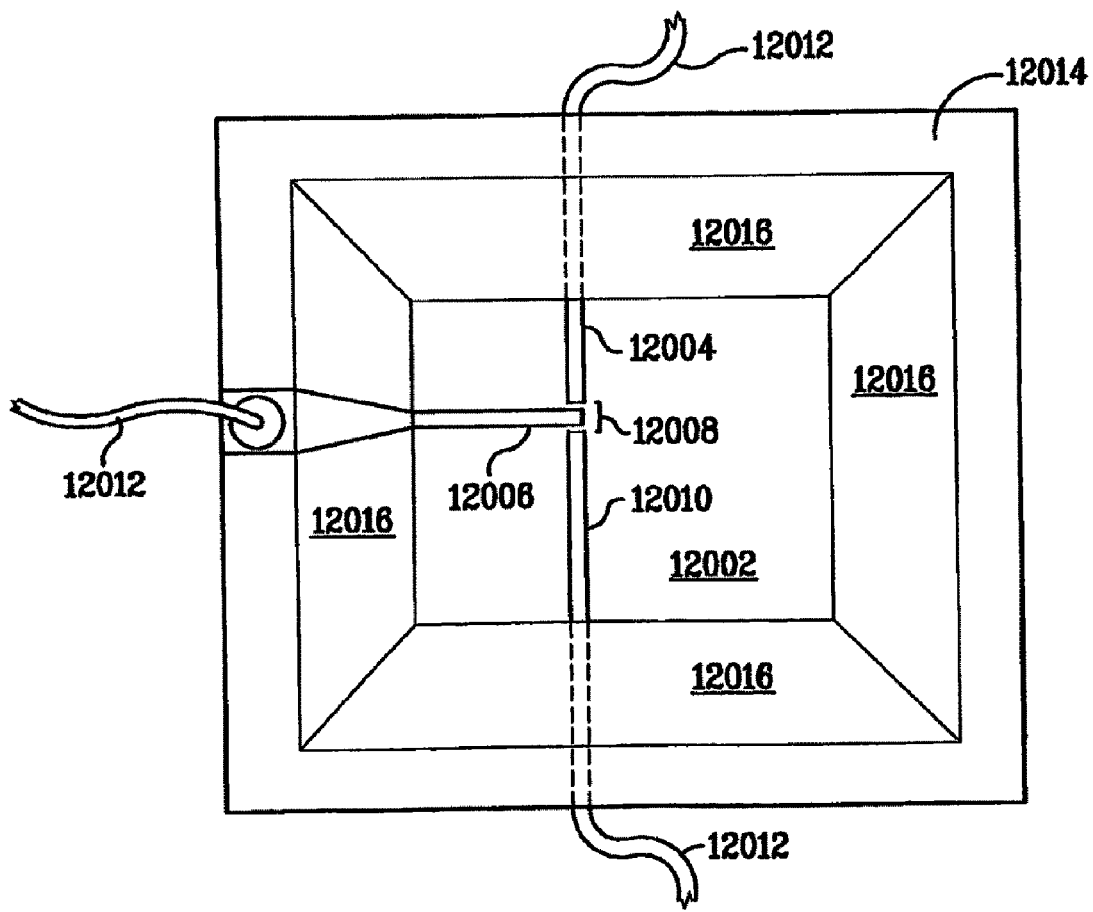
FIG. 12 is a schematic illustration of the bottom perspective view of an embodiment of a device of the present invention.

FIG. 12 is a schematic illustration of the bottom view of an embodiment of a device comprised of a nanogap (12008) defined by two proximate electrodes (12010) and (12004), on a support membrane (12002), which is supported by a supporting structure (12014), and a back side structure (12006). The back side structure is a continuous structure that extends along the sloped surface (12016) of the supporting structure (12014). The structures (12010), (12004) and (12006) are electrically connected to conductive wires (12012) that are connected to an external apparatus (not shown). The support membrane can be insulating and the structures (12010), (12004) and (12006) can be metallic. In this case, the device could function as a nanogap field effect transistor (NGFET) with a source electrode (12004), a drain electrode (12010) and a local gate electrode (12006). The operating behavior of the NGFET will depend upon the electronic properties of a suitable nanostructure, such as a semiconducting nanocrystal, (not shown) that can be placed into the nanogap.

One or more nanostructures can be suitably placed in a nanogap using any of a variety of processes known in the art. Suitable nanostructure manipulation processes include, for example, using an edge effect assembly process, as disclosed in "Nanostructure Assemblies: Methods and Devices Thereof", U.S. Patent Application No. 60/663,637, filed Mar. 21, 2005, the portion of which directed to the edge effect assembly process is incorporated by reference herein, dip pen lithography, chemical bond between electrodes and functionalized nanostructure, growing the nanostructure in the nanogap with a catalyst. Additional details that teach how to manipulate molecularly linked nanostructures and electrodes can be found in the following references: Klein, D. L.; Roth, R.; Lim, A. K. L.; Alivisatos, A. P.; McEuen, P. L. *Nature* 1997, 389, 701; Chen, J.; Reed, M. A.; Rawlett, A. M.; Tour, J. M. *Science* 1999, 286, 1550; and Sun, L. F.; Chin, S. N.; Marx, E.; Curtis, K. S.; Greenham, N. C.; Ford, C. J. B. *Nanotechnology* 2005, 16, 631. Electrostatic trapping can also be used and is described in Bezryadin, A.; Dekker, C. J. *Vac. Sci. Technol. B* 1997, 15(4), 793.

Figure 13:
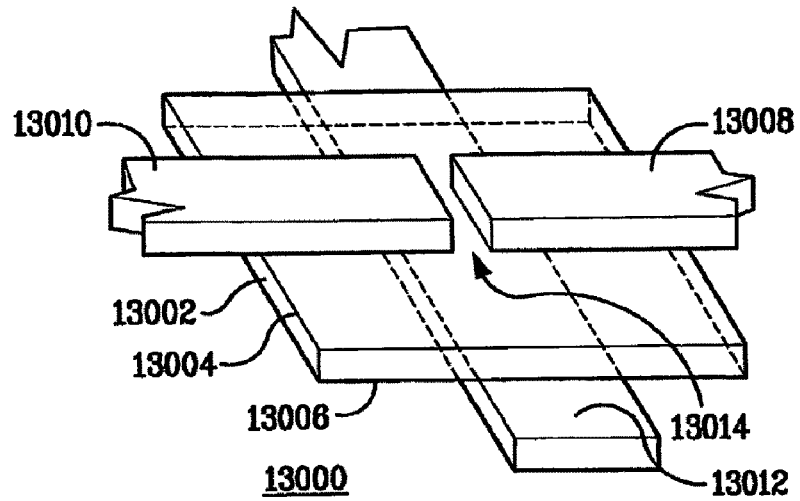
FIG. 13 is a schematic illustration of an embodiment of a device of the present invention.

FIG. 13 is a schematic illustration of a close view of an embodiment of the present invention in which a nanogap (13014) is defined by two proximate electrodes (13010) and (13008) sitting on the top side (13004) of a support membrane (13002) and a structure (13012) situated on the back side (13006) of the support membrane. This device can be operated as a nanogap field effect transistor with a source electrode (13010), a drain electrode (13008) which are electrically isolated by an insulating layer (13002) from a local gate electrode (13012).

Figure 14:
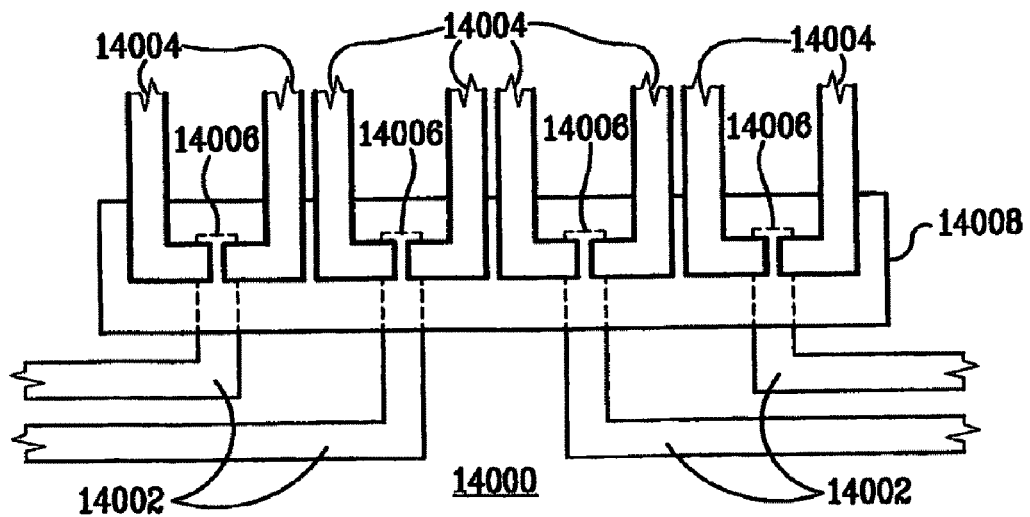
FIG. 14 is a schematic illustration of a device of the present invention composed of four uncoupled NGFETs (nanogap field effect transistors).

FIG. 14 is a schematic illustration of a device composed of four uncoupled NGFETs (nanogap field effect transistors) (14006) composed of source and drain electrodes (14004) separated from their corresponding local gate electrodes (14002) by an insulating support membrane (14008). The NGFETs are uncoupled in the sense that they are all individually addressable. Fewer or more NGFETs could readily be employed. In one embodiment, an uncoupled array of this kind can permit a range of quantum mechanical logic operations in which information is represented by the electronic state of functional nanostructures (not shown) inside each of the NGFETs. The NGFETs are quantum mechanically uncoupled and can be manipulated by changing the quantum mechanical states of the functional nanostructures by changing the voltages on the NGFET electrodes. Quantum mechanical computation is achieved when the input operations (i.e., electronic state changes of the functional nanostructures) yield measurable output signals that can be interpreted to have meaning or perform a function.

Figure 15:
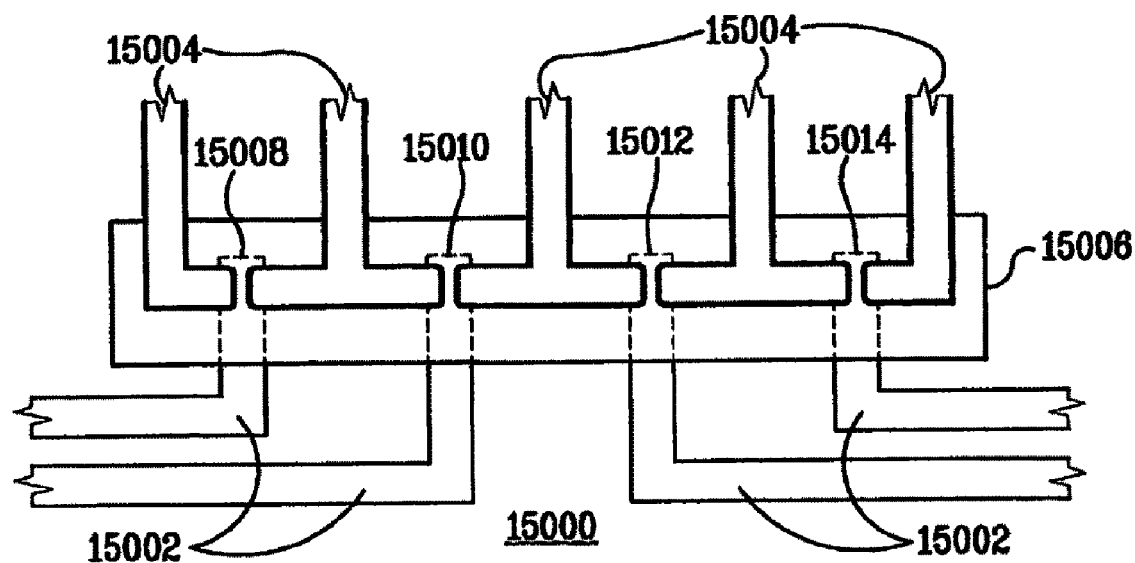
FIG. 15 is a schematic illustration of a device of the present invention composed of a coupled array of NGFETs (nanogap field effect transistors).

FIG. 15 is a schematic illustration of a device composed of a coupled array of NGFETs (nanogap field effect transistors) (15008), (15010), (15012), (15014) composed of source and drain electrodes (15004) separated from their corresponding local gates electrodes (15002) by an insulating support membrane (15006). The NGFETs are coupled in the sense that they are not all required to be individually addressable, although they may be individually addressable. Specifically, any electronic change occurring in (15008) will influence the electronic state of NGFETs (15010), (15012), and (15014). Likewise, any change in any of the four devices will influence the state of the others. A plurality of NGFETs can be used in this fashion for creating quantum computing devices. A coupled array of this kind can provide a range of quantum mechanical logic operations in which information is represented by the electronic state of functional nanostructures (not shown) inside of the NGFETs. The nanostructures are themselves quantum mechanically coupled because of their coupling to the NGFETs. This quantum coupling can be manipulated by changing the quantum mechanical states of the functional nanostructures by changing the voltages on the NGFET electrodes. Quantum mechanical computation is achieved when the input operations (i.e., electronic state changes of the functional nanostructures) yield measurable output signals that can be interpreted to have meaning or perform a function. Certain combinations of nanocrystals may also give rise to a combination of wave equations, Hamiltonians, or both for solving quantum computing problems. Examples of suitable nanocrystals include CdSe, PbSe, InAs, GaAs, CdTe, Au, Ag, Co, Si, spin doped NCs. Combinations of nanostructures (e.g., nanocrystals) can be assembled by using selective chemical bonding of functionalized nanostructures, self-assembly of the nanostructures, alignment and movement of the nanostructures with force fields, for example, electric, magnetic, temperature gradient, fluid flow, or pressure, or any combination thereof. Further details about linking nanocrystals for preparing quantum computers can be found in the following references: *Science*, Vol 301, Issue 5636, 1074-1078, 22 Aug. 2003 (Reports Coherent Spin Transfer Between Molecularly Bridged Quantum Dots by Min Ouyang and David D. Awschalom; *Science, Vol* 301, Issue 5633, 580, 1 Aug. 2003 Quantum Dots Chemically Wired for Spintronics by Robert F. Service.

Figure 16A:
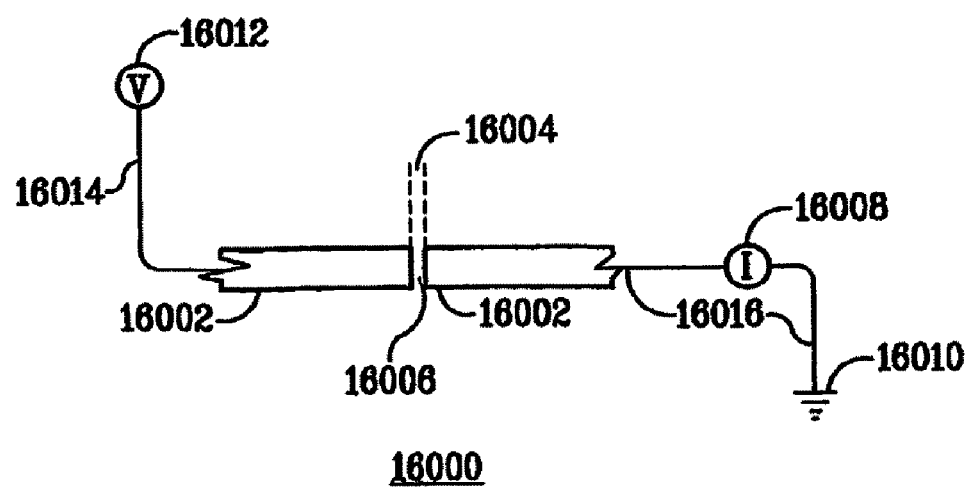
FIG. 16a is a schematic illustration of a device of the present invention made using a nanogap.

FIG. 16*a* is a schematic illustration of a device made using a nanogap. Two proximate electrodes (16002) define a nanogap (16006) having a controllable width (16004). A voltage source (16012) is electrically connected (16014) to one of the electrodes and a current measuring device (16008) is electrically connected (16016) to the other electrode and to electrical ground (16010). This device can be used as a detector. For a sufficiently small nanogap a tunneling current will be measured, which will be extremely sensitive to the nanogap size. If for any reason the source and drain electrodes should move towards or away from each other, a change in the tunneling current will be detected. Therefore the device can be used to detect vibrations and other causes for changes in the nanogap size. Causes for changes in the nanogap size include, for example, gravitation, Casimir Forces, and thermally activated lattice vibrations.

Figure 16B:
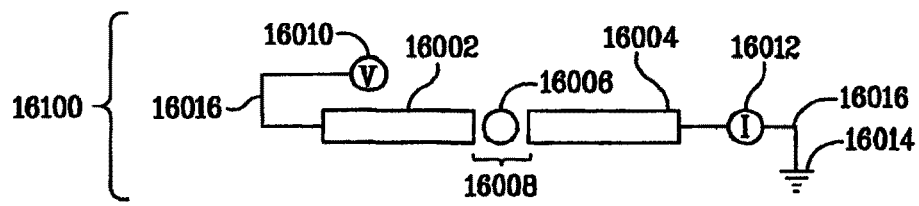
FIGS. 16b-e are schematic illustrations of various embodiments of devices of the present invention having a nanogap and a nanostructure residing within the nanogap.
Figure 16C:
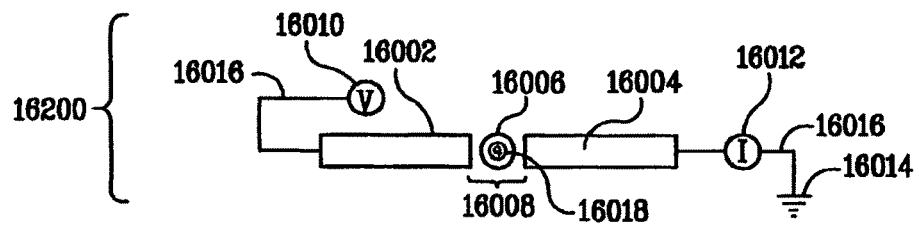
Figure 16D:
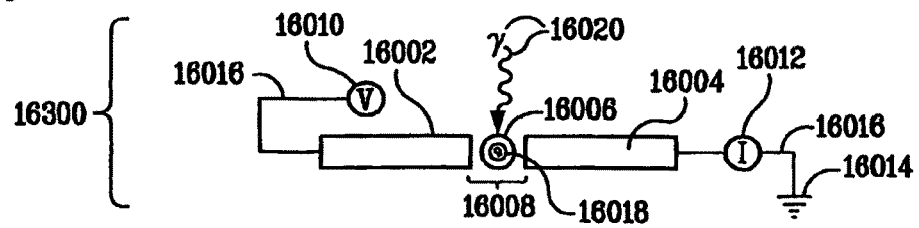
Figure 16E:
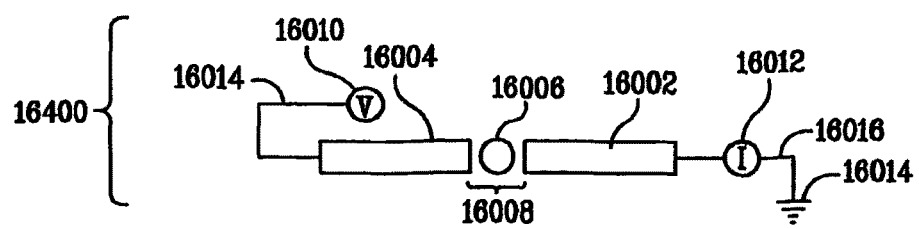

FIGS. 16*b-e* provide schematic illustrations of an embodiment of a device made using a nanogap (16008) and a nanostructure (16006) that can be operated as a digital memory element. In FIG. 16*b*, initially (16100) the nanostructure (16006) is charge neutral and the voltage source (16010) that is electrically connected (16016) to the source electrode (16002) is at the same voltage value as the ground (16014). No current is measured by the current meter (16012). This characterization defines the "0" state of the device. In FIG. 16*b*, the state of the device can be changed (16200) by applying a voltage to the nanostructure. Current can be measured as the voltage source is activated. The "1" state is defined as the state where the nanostructure possesses a net charge (16018). In FIG. 16*c*, the state of the device can be changed back (16300) by either applying a voltage of opposite polarity to that of the first voltage, or by exposing the device to light (16010). This returns the device to its "0" state (16400) as illustrated in FIG. 16*e*. The state of the device can be determined by measuring its conductivity. "0" state corresponds to a high conductivity and "1" corresponds to a low conductivity.

Figure 17A:
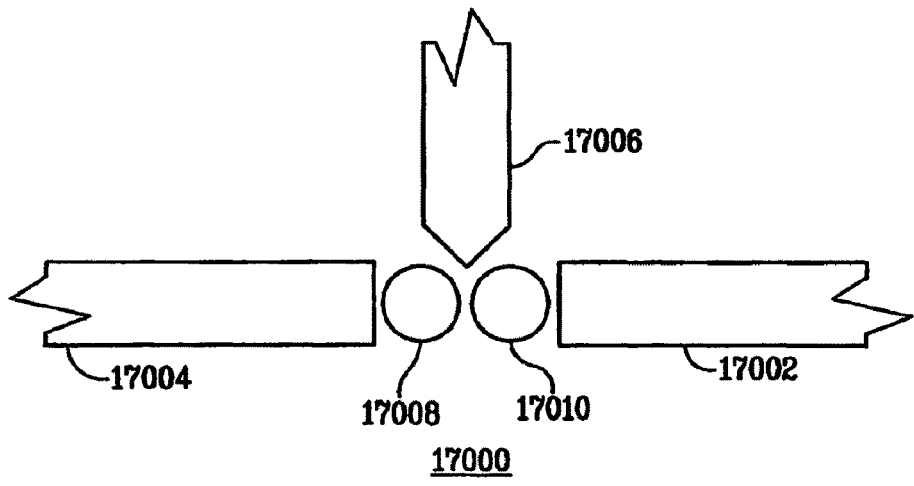
FIG. 17a is a schematic illustration of an embodiment of a device of the present invention having two coupled nanostructures residing within a nanogap region.

FIG. 17*a* is a schematic illustration of a device made from two coupled nanostructures (17008) and (17010) in the nanogap region defined by the source electrode (17004), the drain electrode (17002) and a local gate (17006). The local gate is situated so as to be able to tune the coupling between the two nanostructures. The ability to tune the coupling can allow the device to be used to encode information as a classical or quantum state. For example, the local gate shown in the figure can be used to shift the height of the tunneling barrier between the two structures, either up (to reduce the rate of charge transfer) or down (to increase the rate of charge transfer). Overall, the degree coupling of any charge(s) in the two NCs will affect the likelihood of "entangling" their wavefunctions, and thus helps to facilitate a quantum logic operation.

Figure 17B:
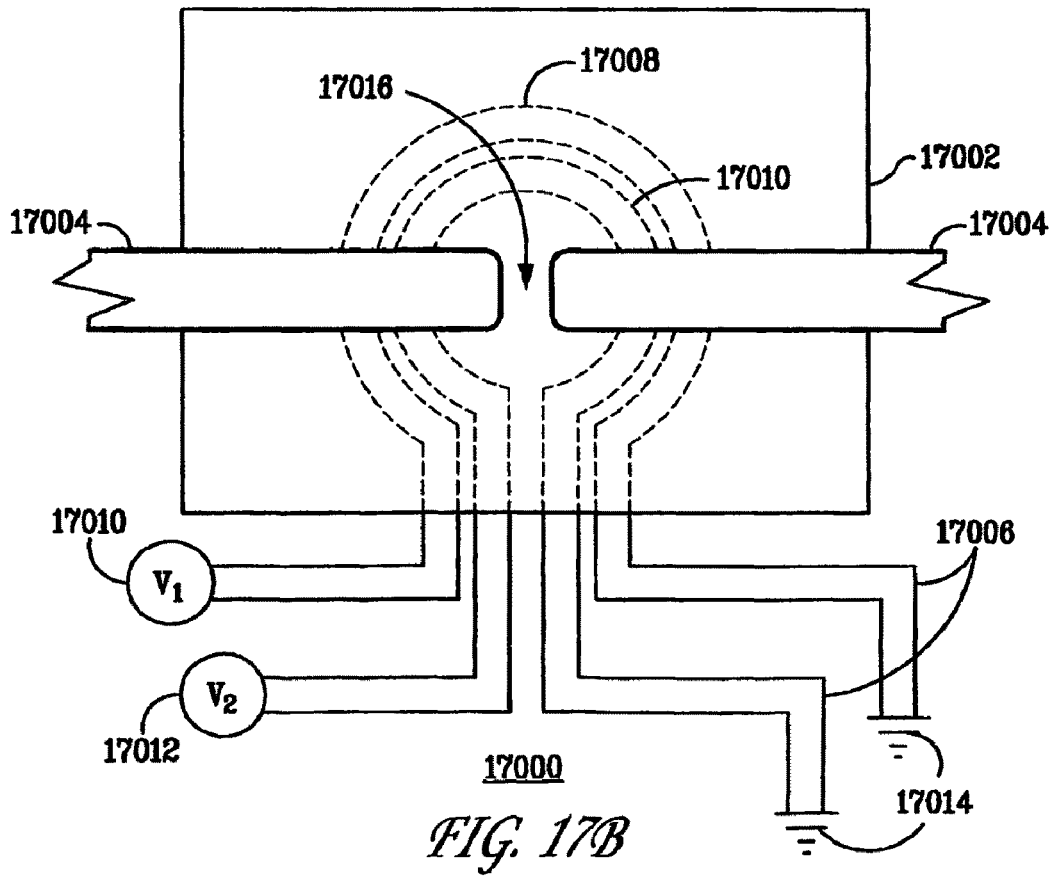
FIG. 17b is a schematic illustration of an embodiment of a device of the present invention having a nanogap defined by two proximate electrodes on one side of a support membrane.

FIG. 17*b* is a schematic illustration of a device in which a nanogap (17016) is defined by two proximate electrodes (17004) on one side of a support membrane (17002). On the opposite side of the support membrane, two looped conductive-wire backstructures (17016) and (17008) are fabricated which are each electrically connected on one end to its own independent voltage source (17010) and (17012) and are both electrically connected to electrical ground (17014) on the other end. The device can be used to apply magnetic fields to a structure or structures (not shown) inside of the nanogap by driving currents through the backstructures (17016) and (17008) with the voltage sources (17010) and (17012). For example, because charge currents induce magnetic fields, the voltages applied to the wires can drive a specific amount of current through them, and thus produce a desired magnetic field.

Figure 18:
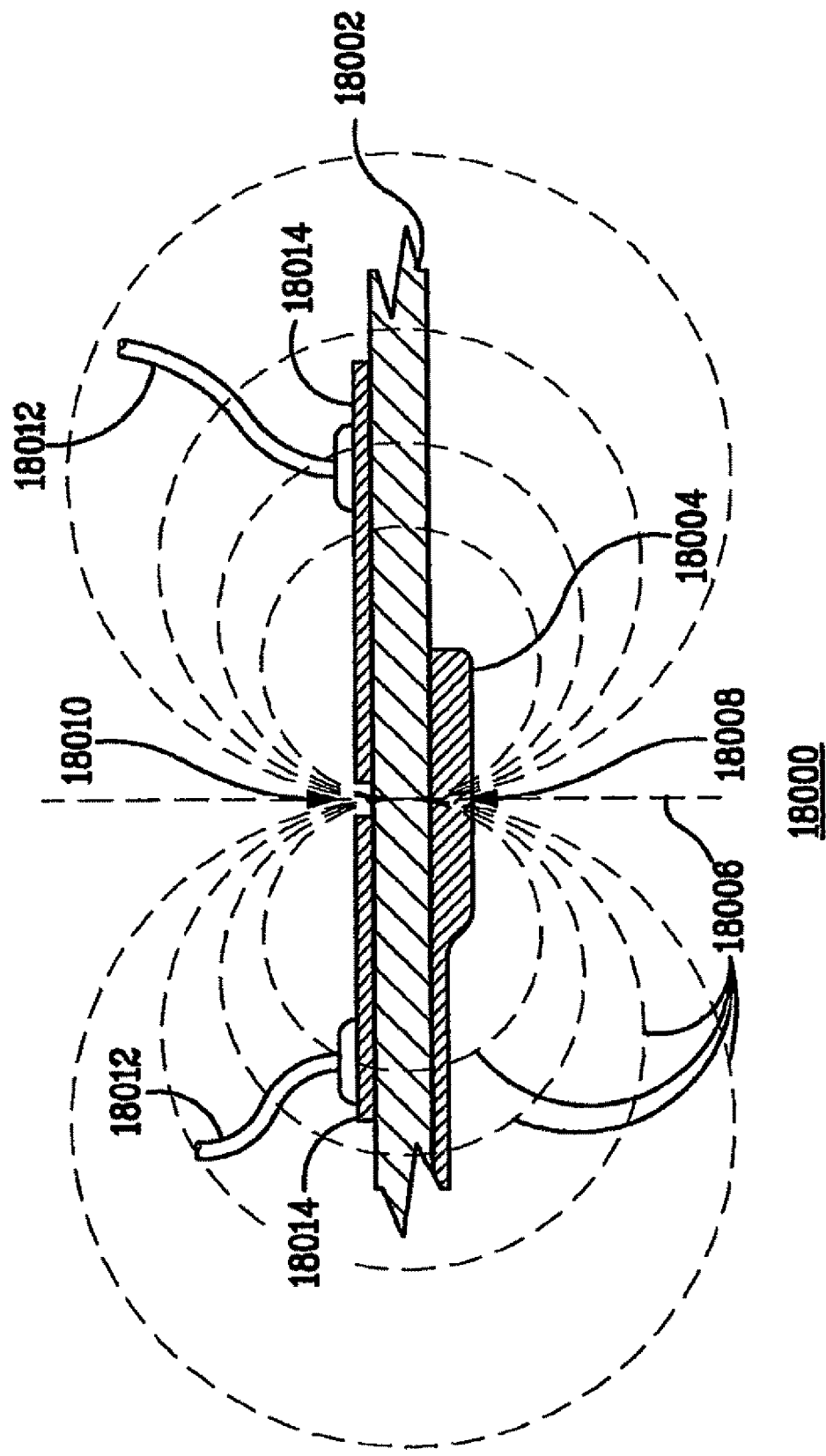
FIG. 18 is a schematic illustration of a side view the device shown in FIG. 17 along with an illustration of the generated magnetic field lines.

FIG. 18 is a schematic illustration of the side view of the device shown in FIG. 17. In this illustration two proximate electrodes (18014) are situated on one side of a support membrane (18002) and are electrically connected to an external apparatus (not shown) with conductive wires (18012). Looped conductive-wire backstructures (18004 and shown from the top in FIG. 17) are used to apply a magnetic field (18006) to the nanogap region (18010). The device can be used to control spins of structures introduced to the nanogap area. For example, spins prefer to align along magnetic field lines by splitting the energy degeneracy between the two possible spin orientations. The wires make it possible to produce magnetic fields that will align spins as they move into the nanogap region. If spins are pre-aligned into an unchangeable orientation by some other process, the magnetic field effectively could act as a spin filter, allowing those spins with the correct orientation to pass through the nanogap region. Rapid changes of the magnetic field can make it possible to entangle spins while they are in the nanogap region.

Figure 19:
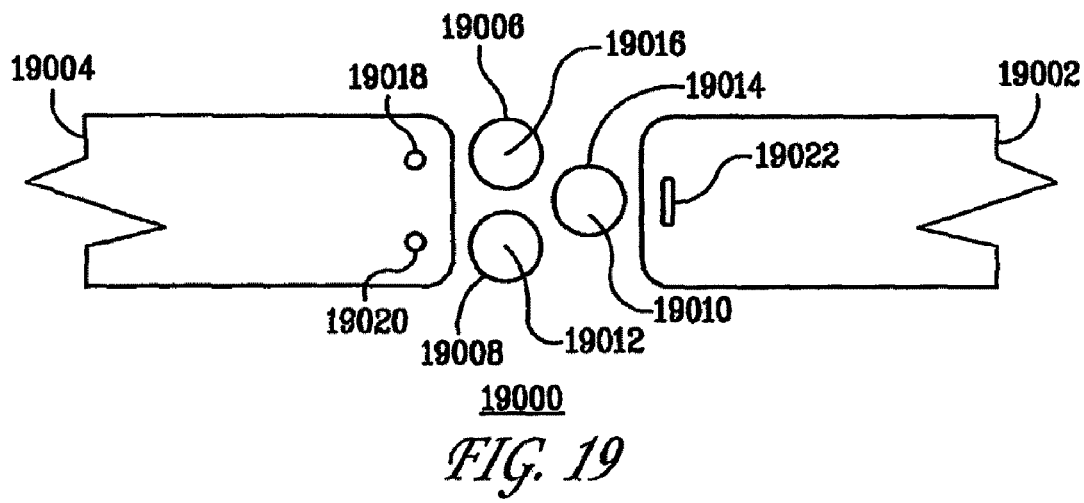
FIG. 19 is a schematic illustration of an embodiment of a device of the present invention in which a plurality of nanostructures is situated between a source electrode that is closely spaced to a drain electrode.

FIG. 19 is a schematic illustration of an embodiment of a device of the present invention in which a plurality of nanostructures is situated within a nanogap between a source electrode (19004) and a drain electrode (19002). Uncorrelated charges (19020) and (19018) are injected into the nanostructures (19006) and (19008) adjacent to the source electrode by applying a voltage to either the source or the drain electrode or both. Voltages are used to force electrons to move from the nanostructures (19006) and (19008) adjacent to the source electrode (19004) to the nanostructure (19014) adjacent to the drain electrode. Additional nanostructures can also be provided adjacent to the drain electrode in other embodiments. If the number of charges is greater than the number of nanostructures adjacent to the drain electrode, then charges can become quantum mechanically coupled as they are forced to compete for available states. The drain electrode extracts quantum mechanically coupled charges (19022). For example, when two electrons having the same energy are injected into the left pair of nanostructures (19006) and (19008), they will feel a force (applied by the voltage drop across the nanogap) to move into the right nanostructure (19014). The wave functions of the two electrons can be made to overlap significantly as they both try to occupy the same state inside of the right nanostructure, and thus become entangled. The two electrons are likely to both want to go into the same state because there is most likely one energy level that is closest to the energy of the electrons—so they will both want to go to that state. The entangled pair of electrons can be extracted from the right nanostructure with the right electrode without destroying the coherence of the entanglement. The entangled pair of electrons are then moved controllably to a location where they are used for one or more logic operations. The two electrons can also form a Cooper Pair and therefore this scheme can serve to be a source of a supercurrent for superconductivity.

Figure 20:
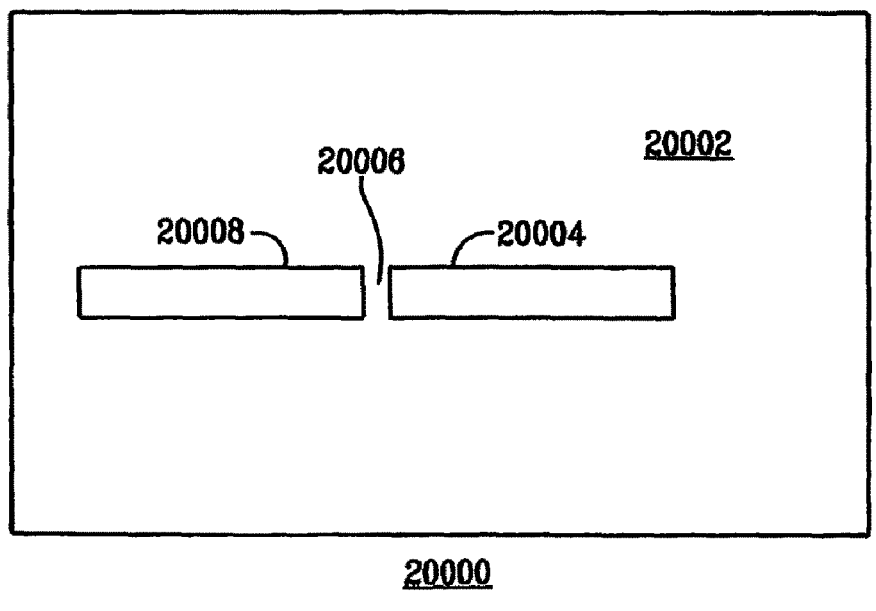
FIG. 20 is a schematic illustration of an embodiment of the method of the present invention for making a mask having a nanofeature.

FIG. 20 is a schematic illustration of an embodiment of an application of the invention for making a mask. Instead of depositing metal onto the device embodied in FIG. 2, an etchant can be deposited instead. The etchant removes sections of the support membrane (20002) that mirrors the distribution of exposed imageable layer. Two proximately exposed sections of imageable layer can provide two proximately placed etched regions (20008) and (20004) separated by an unexposed section of the support membrane that gives rise to a support membrane nanofeature (20006).

Figure 21:
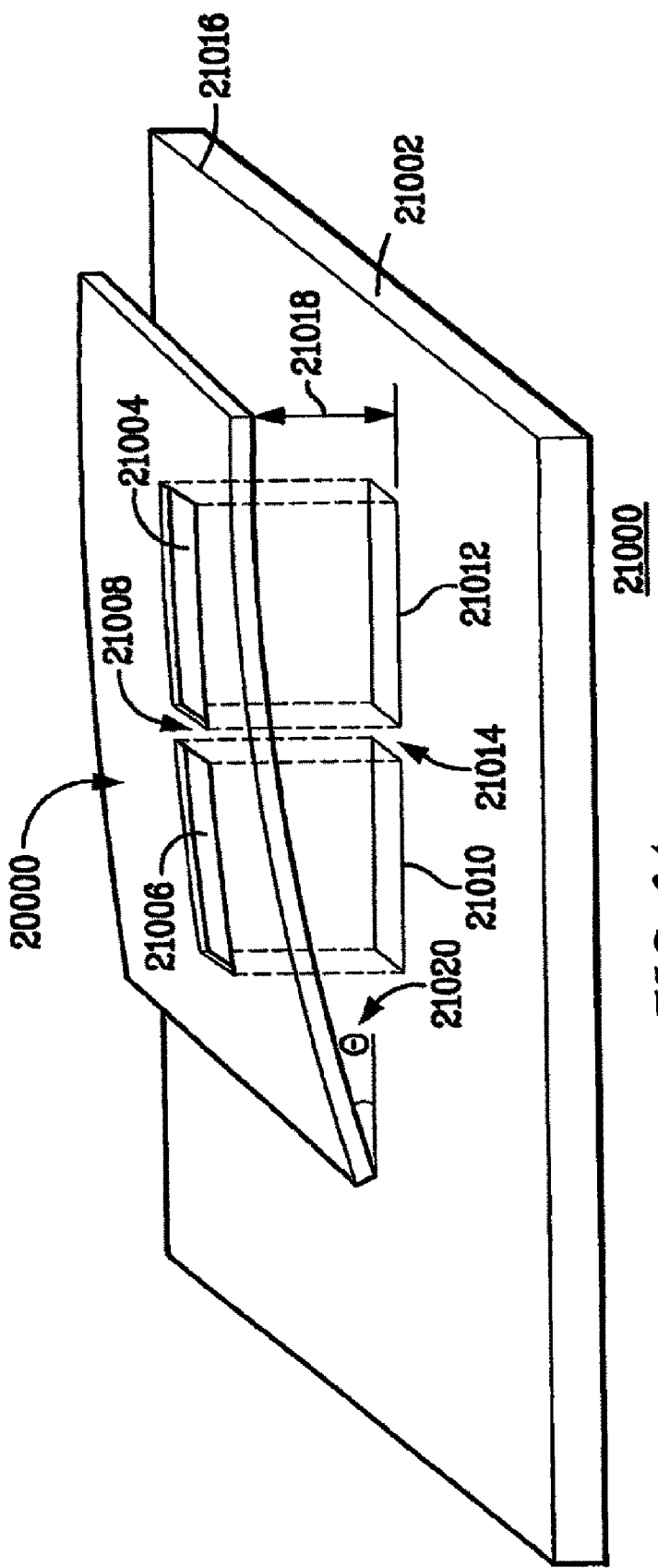
FIG. 21 is a schematic illustration of an embodiment of the present invention in which the mask of FIG. 20 is used in fabricate a nanogap on a substrate.

FIG. 21 is a schematic illustration of the mask application being used to fabricate a nanogap on the top side (21008) of a new surface (21002). The mask (20000) has two sections removed from it (21006) and (21004). The mask acts as a stencil for the deposition of material onto the new surface. The mask areas (21006) and (21004) yield structures (21010) and (21012), respectively. A support membrane nanofeature (21008) on the mask gives rise to a nanogap (21014) on the new surface. The mask is kept at a height (21018) away from the new surface and at angle (21010) with respect to the new surface. For any mask, the size of the nanogap (21014) formed on surface (21002) can be controlled by changing the angle (21020) and height (21018) of the mask (20000).

Figure 22A:
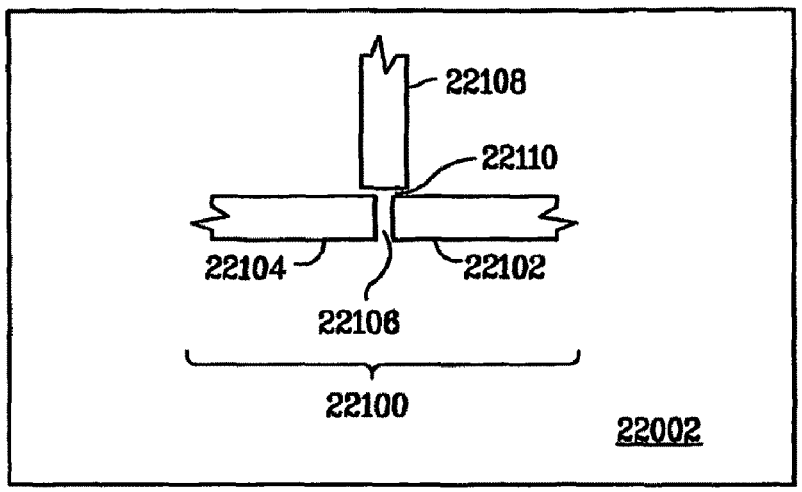
Figure 22B:
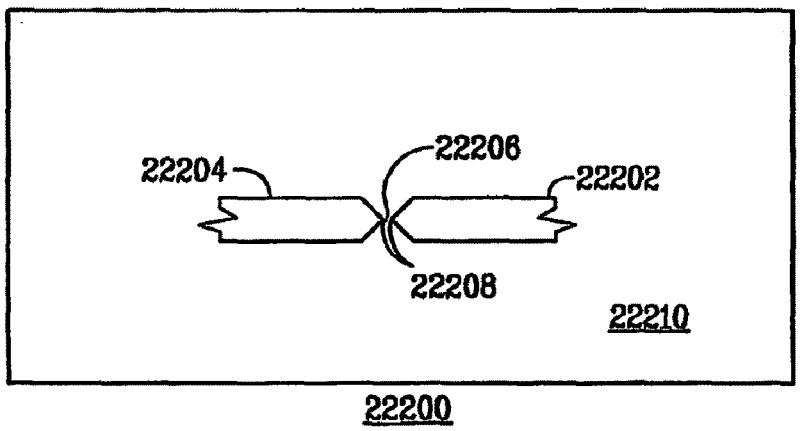
Figure 22C:
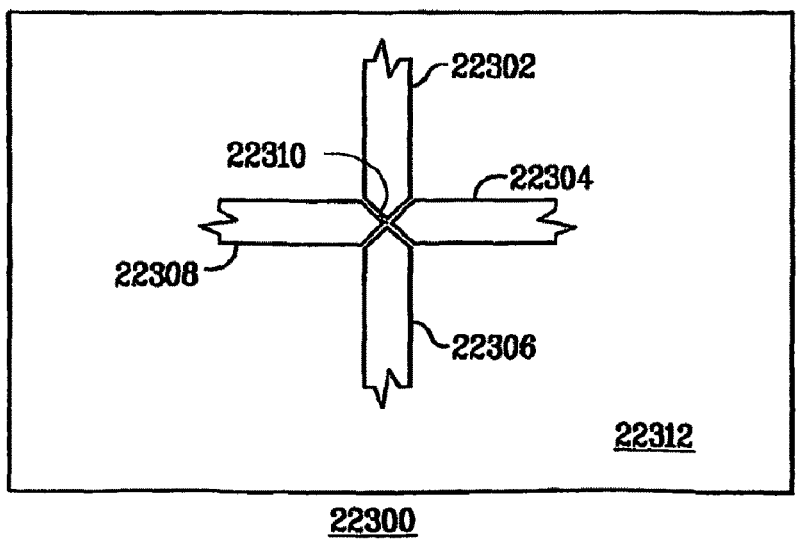

FIGS. 22*a-d* provide schematic illustrations of several embodiments of the structural nanogap geometries that can be made according to the present invention. In FIG. 22*a* (22100) a nanogap (22106) is provided by a proximately placed source electrode (22104) and drain electrode (22102) is adjacent to a local gate electrode (22108) that is situated on the same side of the support membrane (22002). In FIG. 22*b* (22200) a geometry consisting of two sharp ended (22208) electrodes (22204) and (22202) situated on a support membrane (22210). In FIG. 22*c* (22300) a four-probe nanogap geometry is provided using four electrodes. Possible functions of these four electrodes can include use as a source of charge, a drain of charge, a local gate or any combination thereof. FIG. 22*d* (22500) illustrates two closely spaced structures separated by a nanogap region (22504) in an arbitrary wavy pattern. The left (22508) and right (22506) structures can serve as walls so that the nanogap region (22504) can serve as a channel for fluid or gaseous flow of particles along the surface of the support membrane (22502).

In one embodiment, a method of providing nanoscale features is substantially free from all of the problems that the prior methods suffer from. In the field of patterning complicated nanoscale structures onto surfaces, a high resolution imaging process, such as electron-beam lithography ("EBL") is used to achieve high resolution. For example, nanoscale resolutions of 20-50 nm features on typical EBL machines. EBL is a several step process that typically uses a doped silicon substrate coated with a several hundred nanometer thick oxide layer. An additional layer of an imageable layer, such as a photoresist, is formed on the insulating layer by a suitable coating process, for example, spin-coating. Other coating processes can be suitably used. The wafer is then placed in a high vacuum environment where it is exposed to a focused electron beam in targeted areas. The resist is exposed to electrons with energies sufficient to break the covalent polymer bonds in the targeted areas. The molecular weight of the polymers (e.g., PMMA) is therefore reduced and their solubility is increased significantly. Upon being removed from the vacuum writing chamber, the wafer is rinsed with a suitable solvent, (e.g., a combination of MIBK and IPA solution, 1:3 volume ratio) which dissolves the resist. The remaining resist acts as a stencil of the lithographically defined pattern. The surface can either be etched in this pattern (e.g., with $SF_6$) to form trenches or holes, or a material can be deposited to form the desired nanoscale features. To make electronic devices, metal can be evaporated onto the surface to form wires. This is commonly referred to as "metallization". The metal that is evaporated onto the wafer will make contact with the substrate in the areas where resist has been removed and the insulating layer is exposed. Elsewhere, the metallic atoms make contact with the resist and are removed when the resist is washed away with acetone in a subsequent step. An EBL defined pattern of the evaporated metal is all that remains on the substrate after this so called "lift-off" step is completed.

Figure 23A:
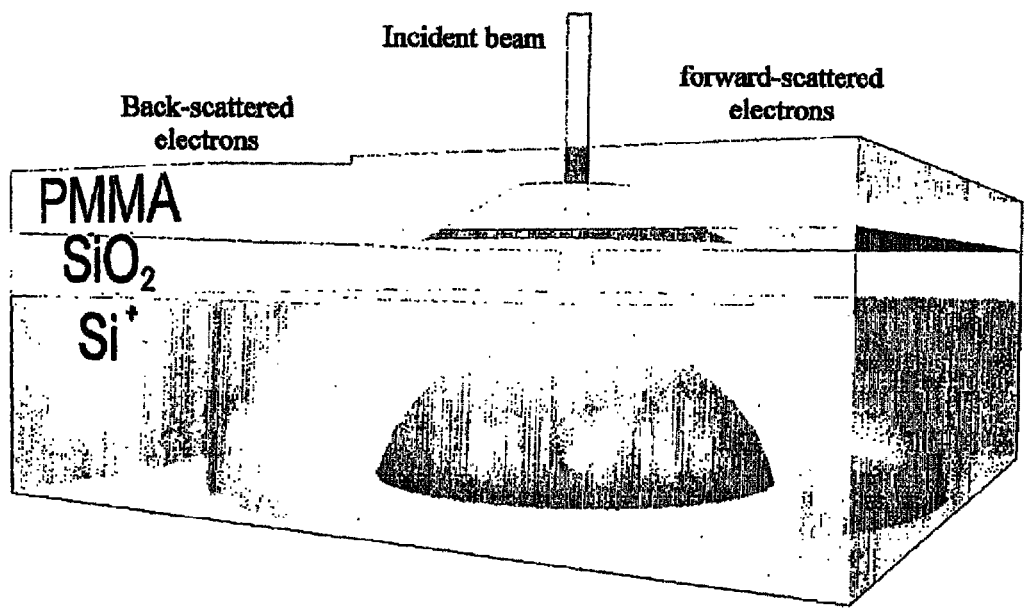
FIG. 23a shows a schematic illustration of the trajectories of electrons as they move through a photoresist layer, an oxide layer and a thick silicon substrate.

A primary factor that limits the feature resolution of EEL is circumvented in the synthesis of nanogaps as described herein. The diameter of an electron beam can be focused down to less than one nanometer however, the smallest features that can be written into the resist is an order of magnitude larger than the beam diameter when EBL is performed on the standard insulator on doped silicon wafer (Broers, A. N., *IBM J. Res. Develop.*, 1988, 32, 4). Without being limited by any theory of operation, FIG. 23*a* shows a schematic of the trajectories of electrons moving through different materials. As indicated in the figure, the incident electron beam actually passes through the PMMA resist and the insulating layer (in this example, $SiO_2$) without affecting most of the resist polymers' bonds. It is when these "forward-scattered" electrons reach the doped silicon layer that a large number of electrons in the silicon get ionized and are emitted from the surface with energies up to 20 eV. Electrons with energies 5 eV and higher are sufficient to break the PMMA polymer bonds. The size of this burst of "back-scattered" electrons therefore largely determines the size of the feature written. In general, areas which can be intended to remain unexposed can actually be exposed to a large dose of energetic electrons. This phenomenon is known as the "Proximity Effect" Chang, T. H. P., *J. Vac. Sci. Technol. B.*, 1975, 12, 1271. If the distributions of electron scattering are assumed to be Gaussian with "characteristic widths", $\sigma_f$ and $\sigma_b$, for the forward-scattered and back-scattered electrons, respectively, then the distribution of total resist exposure is given approximately by the Energy Deposition Function (EDF) Parikh, M.; Kyser, D. *J. Appl. Phys.* 1979, 50, 1104, $$F_p(r)=k[\exp(-(r/\sigma_f)^2+\eta(\sigma_f/\sigma_b)^2\exp(-(r/\sigma_b)^2]. \quad (1)$$

In this expression, r is the radial distance from the exposure center, η is the ratio between the energy dissipation of back-scattered electrons and the incident electrons along the beam axis and k is a constant used to normalize the function to 1 at r=0. Kyser and Parikh reported values of η=0.51, $\sigma_f$=0.06 μm and $\sigma_b$=2.6 μm for a 500 nm-thick resist layer on a silicon substrate with a 25 keV electron beam Parikh, M.; Kyser, D. J. *App. Phys.* 1979, 50, 1104. In general, the value of $\sigma_f$ decreases with increasing accelerating voltage while $\sigma_b$, increases and both are dependent on the electron beam energy and resist thickness. $\sigma_b$, also depends on the substrate material because of the sensitivity of the electron scattering cross-section to the atomic weight of the scatterer. In contrast, n is nearly independent of these values. According to Eq. (1), exposure is ~0.5 at r=0.36 μm for the stated parameters in the limit of an infinitely narrow incident beam. The finite width of the incident electron beam can also be described by a Gaussian with characteristic width, β, and is easily incorporated into the EDF by replacing $\sigma_f$ and $\sigma_b$ with $(\sigma_f^2+\beta^2)^{1/2}$ and $(\sigma_b^2+\beta^2)^{1/2}$, respectively.

Figure 23B:
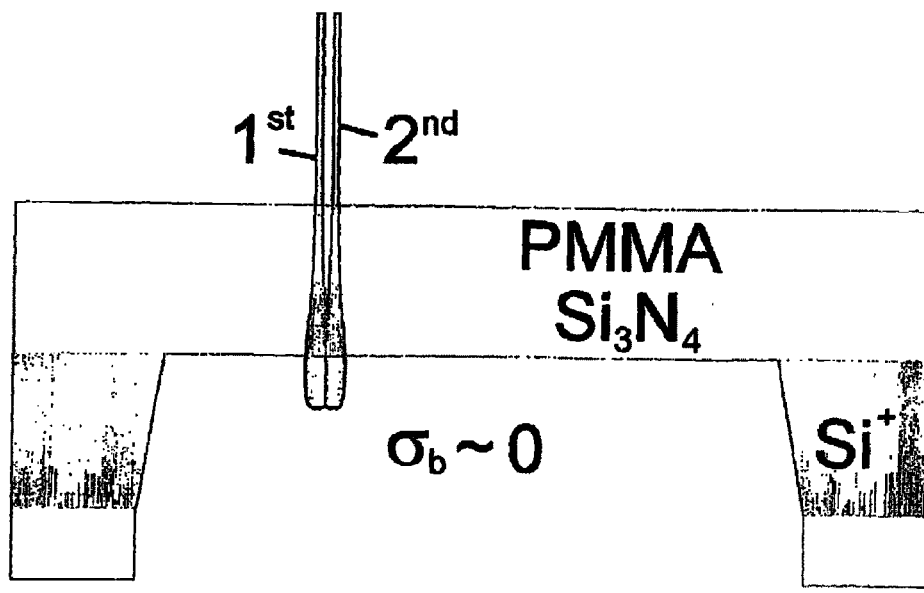
FIG. 23b shows a schematic illustration of a suitable support membrane covered by a suitable imageable layer used in various embodiments of the present invention.

The procedure demonstrated for the production of nanogaps and other small structures in these examples is based on minimizing $\sigma_b$ and allowing the feature size to be limited instead by the much smaller value $\sigma_f$. This is achieved by selectively removing complete sections of the doped silicon beneath specific regions of the insulating layer. FIG. 23b shows a schematic of a suitable support membrane-supported substrate used in an embodiment of the present invention. A supported $Si_3N_4$ support membrane is provided that spans an opening in a layer of (positively) doped silicon. For EBL performed on the thin support membrane region, electron back-scattering is negligible (i.e., $\sigma_b$~0) and the proximity effect is therefore reduced dramatically. Without being bound by any particular theory of operation, Eq. (1) implies that for EBL performed on insulating support membrane substrates $$F_p(r)\sim\exp[-(r/\sigma_f)^2]. \quad (2)$$

However, the distribution of forward-scattered electrons actually decreases with increasing r even faster than a Gaussian and therefore the distribution of forward-scattered electrons is better approximated by a more detailed consideration of the multiple small angle scattering events of the incident electrons in the resist (for further details, see Scott, W. T., *Rev. Mod. Phys.* 1963, 35, 231).

Because of the extremely narrow distribution of the incident electrons, it is possible to pattern two features down to ~1 nm apart, as is indicated by the closely spaced "1$^{st}$" and "2$^{nd}$" write steps in FIG. 23b. If backscattering were present, the two neighboring features would overlap and result in one continuous feature.

Without being bound by any particular theory of operation, in the limit of no scattering of any kind and an infinitely narrow electron beam, the distribution of exposed PMMA is determined purely by its interaction with the electromagnetic fields produced by the incident electrons. Using first-order time-dependent perturbation theory Lutwyche, M. I. *Microelec. Eng.* 1992, 17, 17, the probability of exposing a PMMA molecule a distance r from a 1-dimensional electron beam can be calculated as $$P(r)=(constant)*\exp\{-r[h^2(T^2/2+mc^2T)^{-1/2}/(4mc^2\pi\Delta E)]\}. \quad (3)$$

Here, T is the kinetic energy of an incident electron, m is its mass, h is Plank's constant, c is the speed of light and ΔE is the energy required to expose a PMMA molecule it is initially in its ground state. The probability for exposure therefore approaches zero exponentially as electron energy increases. Since forward-scattering also decreases as the beam energy increases, the distribution of exposed resist can, in principle, approach the exact diameter of the electron beam for sufficiently high energies. Electron beams several angstroms in diameter have been achieved previously (Broers, A. N., *IBM J. Res. Develop.*, 1988, 32, 4).

Thin resist films can also be used to reduce the spreading of the beam due to forward scattering as it passes through. For example, for a 50 kV electron beam, $\sigma_f$ is reduced from 0.07 μm to 0.013 gm when working with a 60 nm layer of resist instead of a 1 μm thick layer (Id.). Numerous measurements have indicated that feature size is independent of the molecular weight of the resist. The choice of PMMA molecular weight does, however, control the minimum thickness attainable by spin-casting and it is difficult to get below 100 nm thickness. Contamination resists can be used instead of PMMA (Broers, A. N.; Molzen, W. W.; Cuomo, J. J.; Wittels, N. D. *App. Phys. Lett.* 1976, 29, 596), but they are not required as high-quality nanogaps can be achieved even with a ~1 μm thick layer of PMMA.

Figure 24:
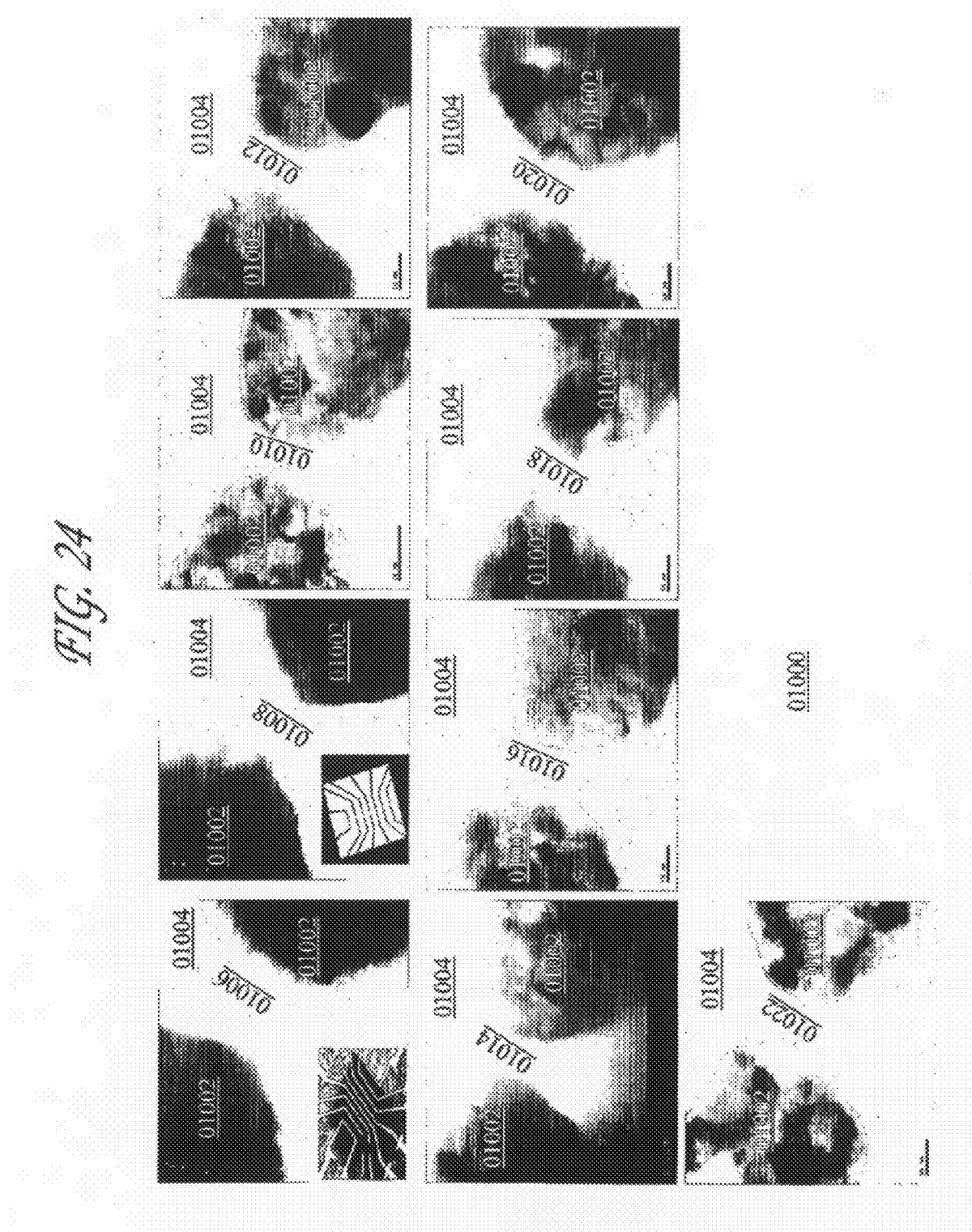
FIG. 24 shows TEM images of devices made according to various embodiments of the present invention.

FIG. 24 shows Transmission Electron Microscopy (TEM) images of actual devices made with the present invention. Gold electrodes (01002) are situated proximately on a support membrane (01004) and define a nanogap. The size of the nanogaps shown are 3 nm (01006), 4 nm (01008), 5 nm (01010), 6 nm (01012), 8 nm (01014), 9 nm (01016), 10 nm (01018), 11 nm (01020) and 12 nm (01022).

Figure 25:
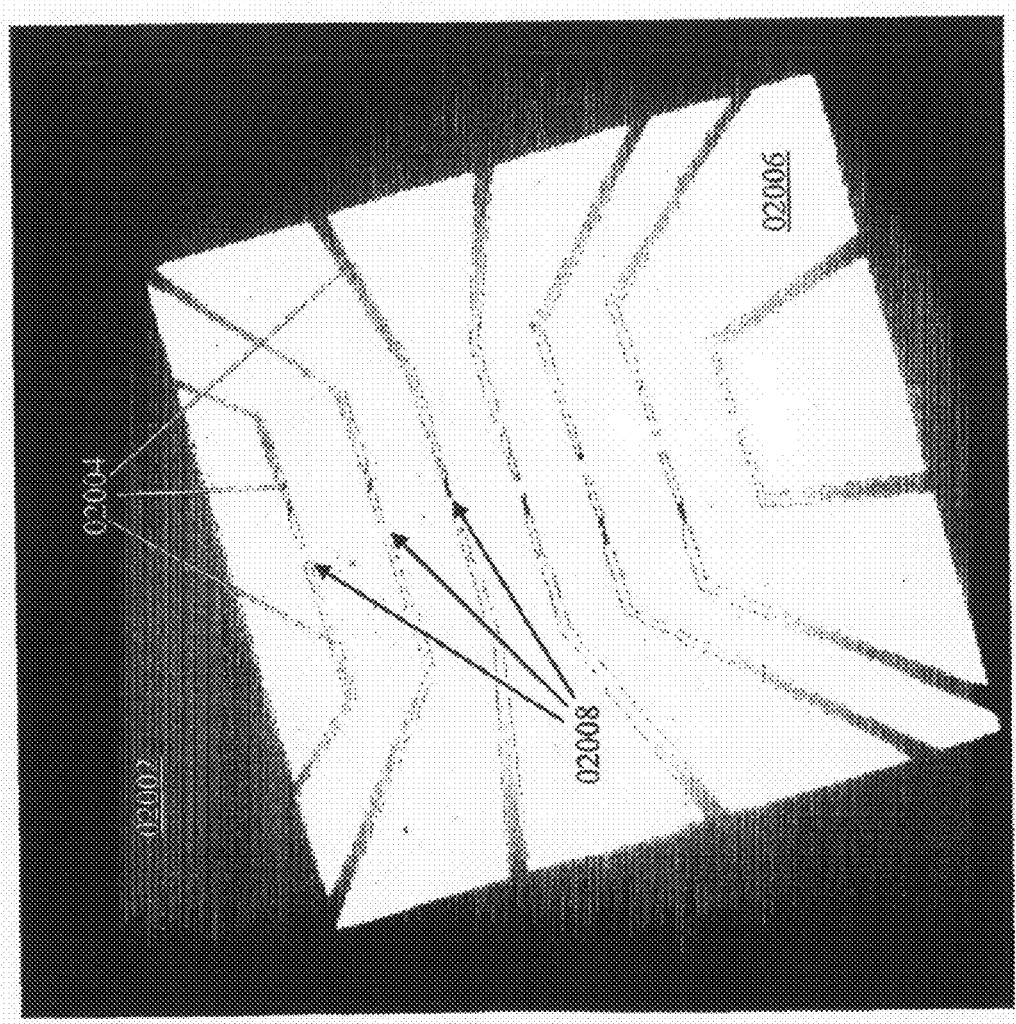
FIG. 25 shows a TEM image of a device comprising a plurality of nanogaps between electrodes on a support membrane made according to an embodiment of the present invention.

FIG. 25 shows a TEM image of seven gaps (02008) defined by proximately placed electrodes (02004) on a support membrane (02006) which spans an opening in the support layer (02002).

Figure 26:
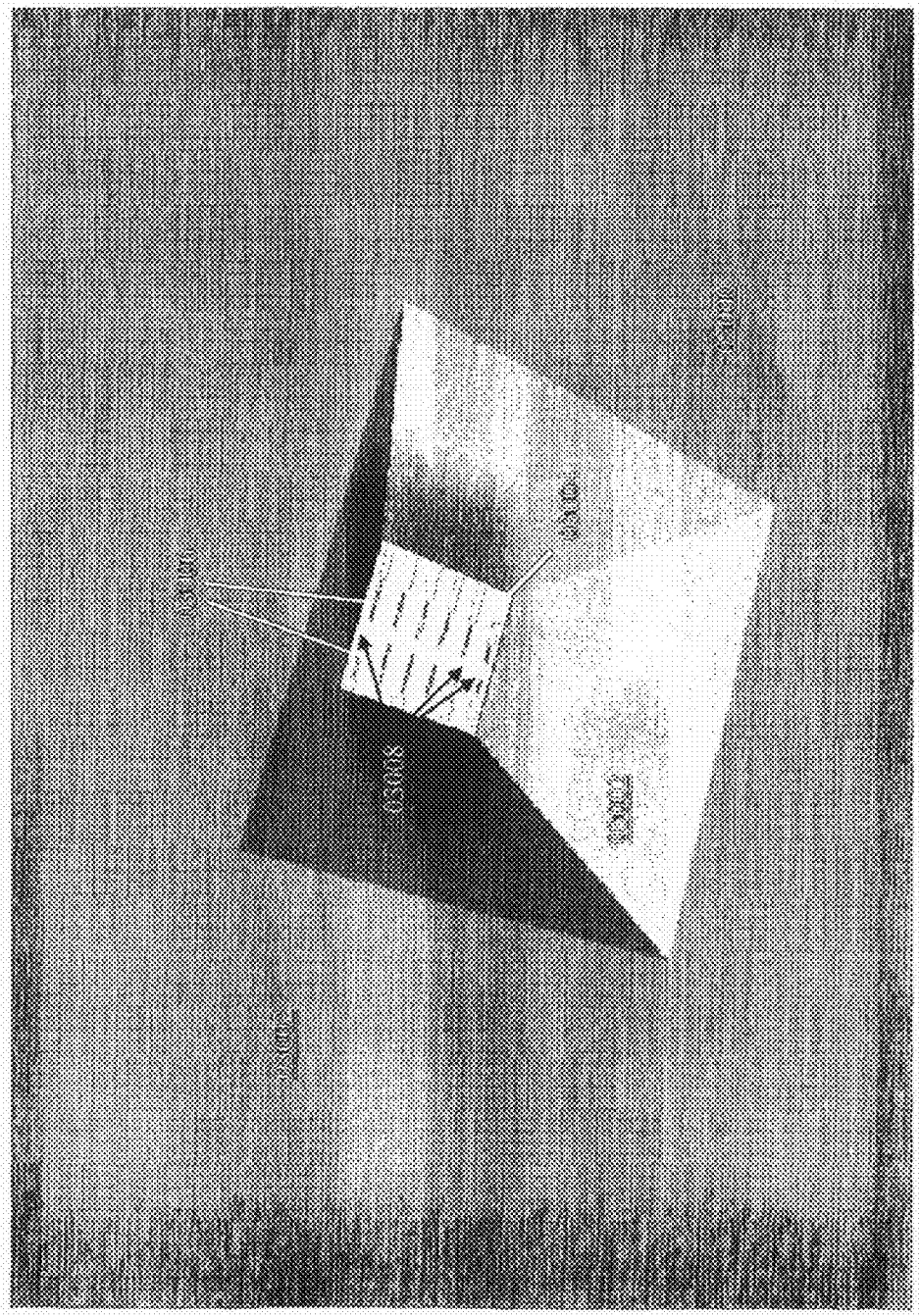
FIG. 26 is a schematic illustration of an embodiment of a device made according to the present invention. The view is from underneath the device.

FIG. 26 is a schematic illustration of an embodiment of a device made with the present invention. The view is from underneath the device. Proximately placed electrodes (03006) define nanogaps (03008) on a support membrane (03004) that spans an opening in a support layer (03002).

Figure 27:
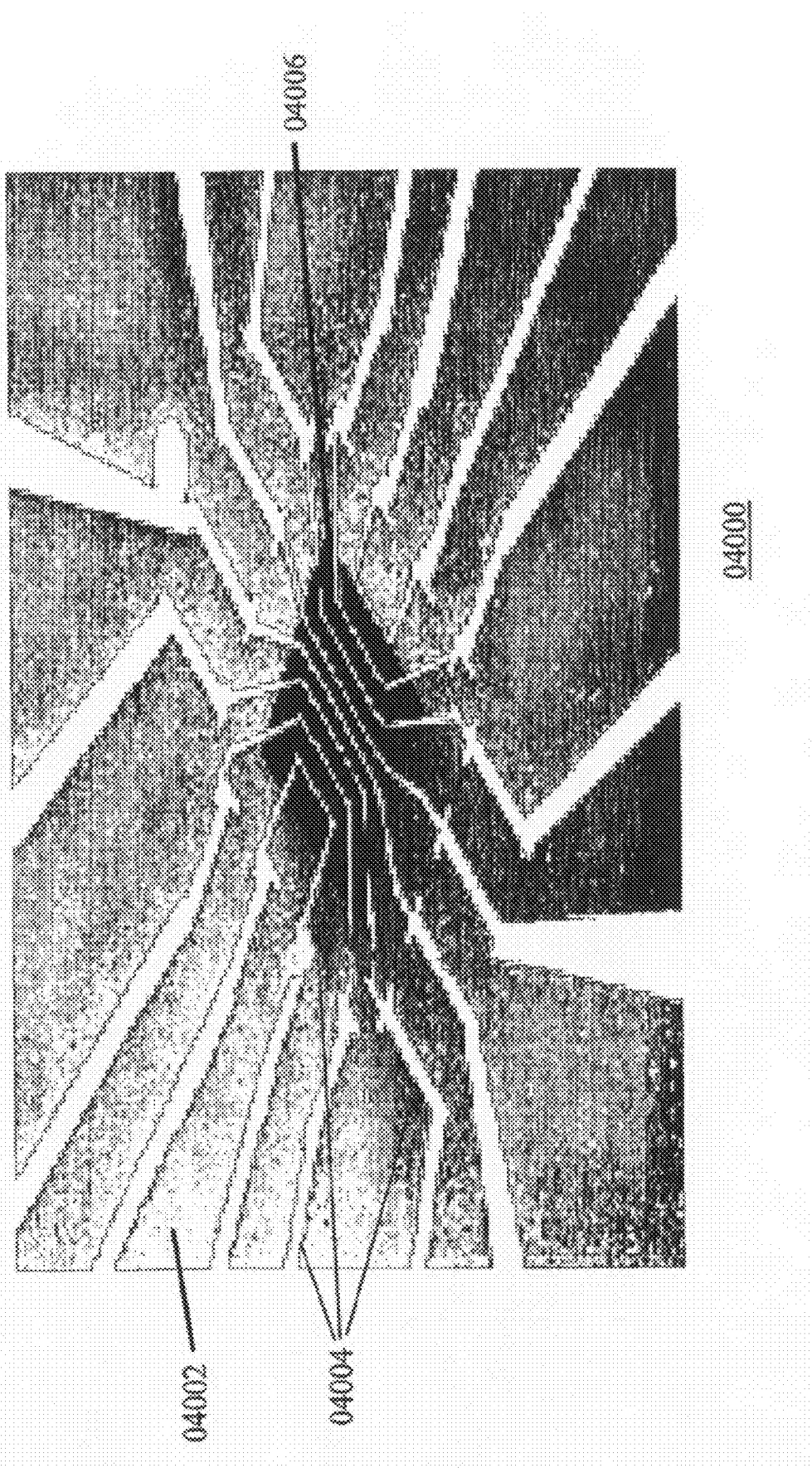
FIG. 27 is a Scanning Electron Microscopy (SEM) image of a device made according to the present invention.

FIG. 27 is a Scanning Electron Microscopy (SEM) image of a device made with the present invention. Electrodes (04004) on a support membrane (04006) define nanogaps (the nanogaps cannot be seen due to the resolution of the image) and are connected to areas composed of a support membrane supported by a supporting layer (04002).

Figure 28:
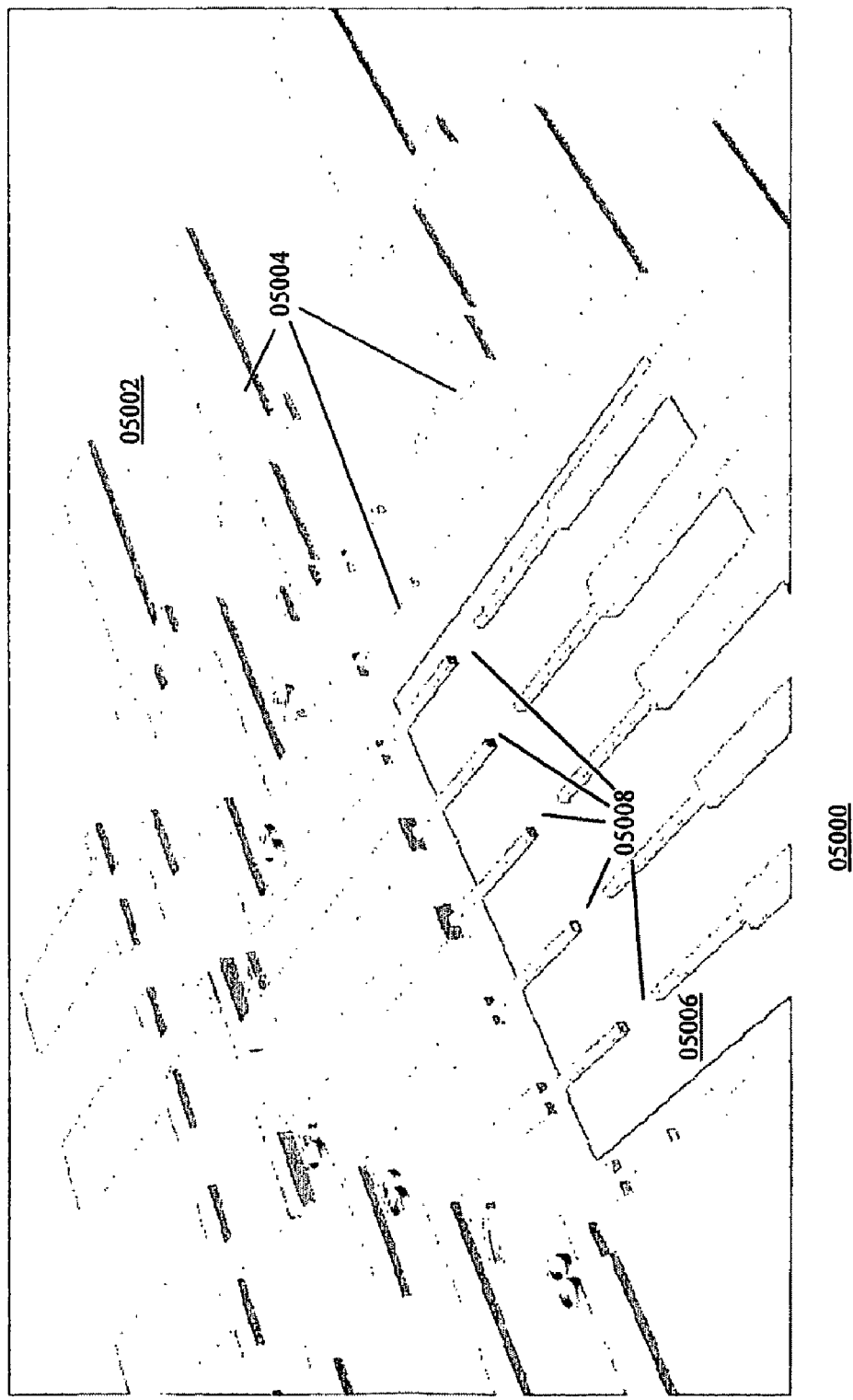
FIG. 28 is a schematic illustration of an embodiment of a device made according to the present invention. The term "PMMA", which is an acronym for polymethyl methacrylate, refers generally to an imageable layer.

FIG. 28 is a schematic illustration of an embodiment of a device made with the present invention. Proximately placed electrodes (05004) define nanogaps (05008) on a support membrane (05006) that spans an opening in a supporting layer (05002).

Figure 29A:
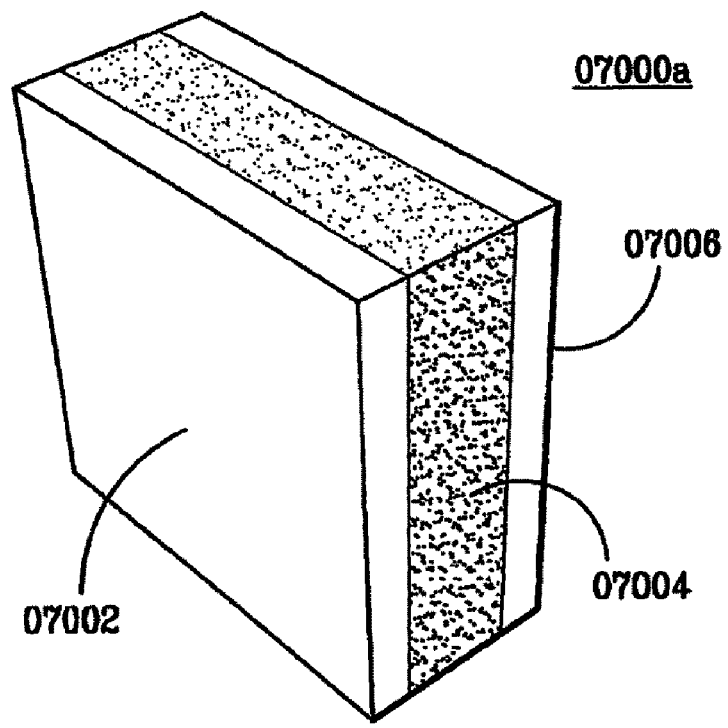
FIGS. 29a-f schematically illustrate a method for making a support membrane.
Figure 29B:
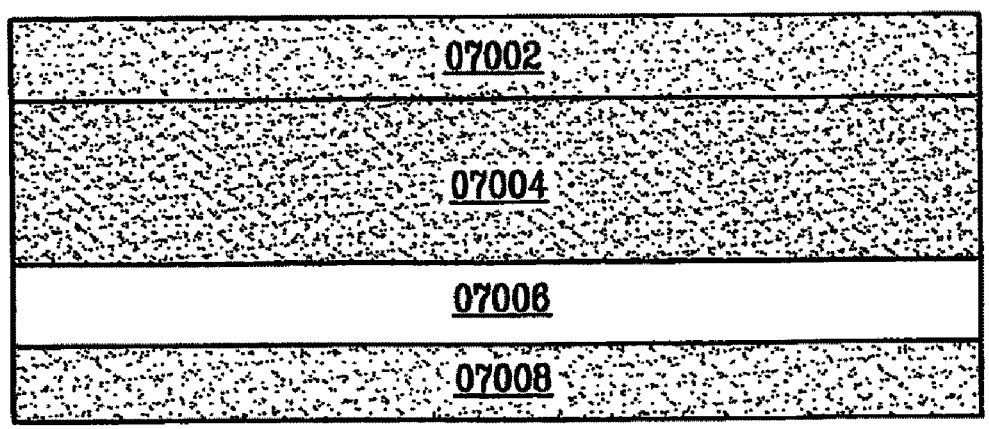
Figure 29C:
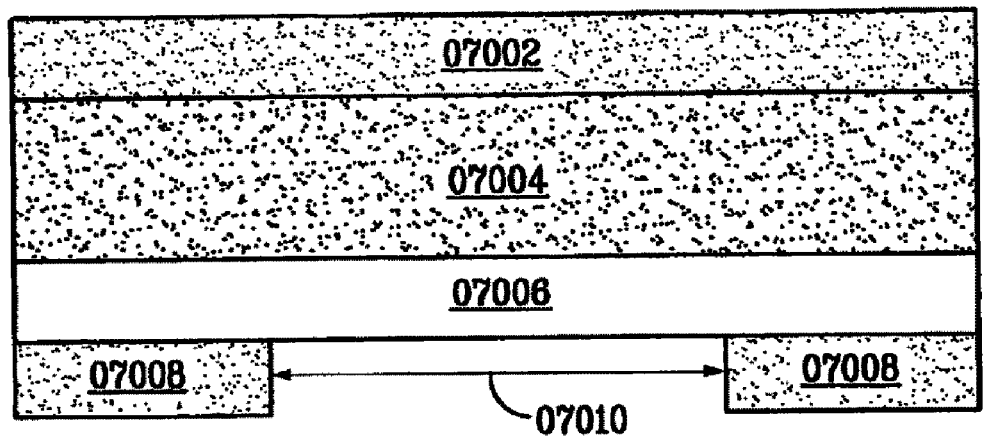
Figure 29D:
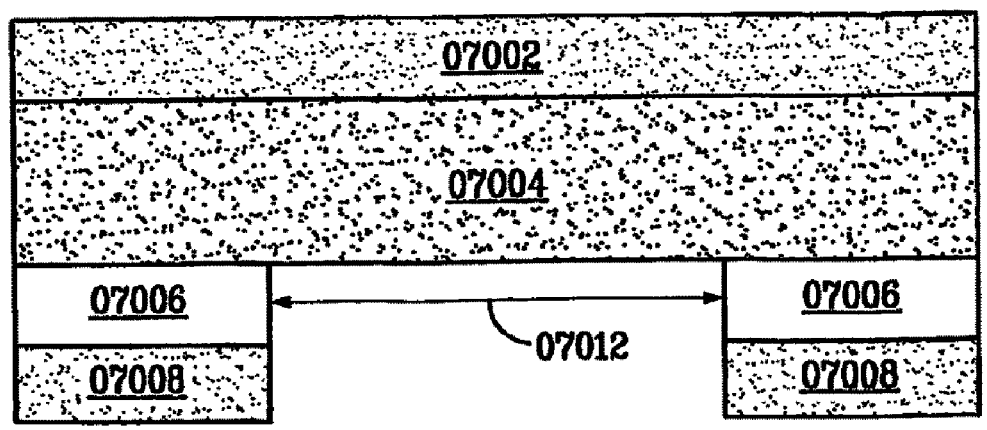
Figure 29E:
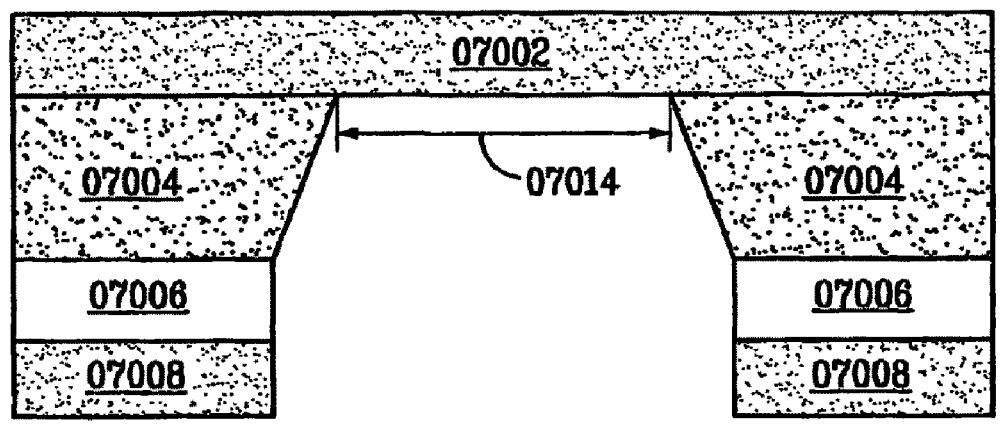
Figure 29F:
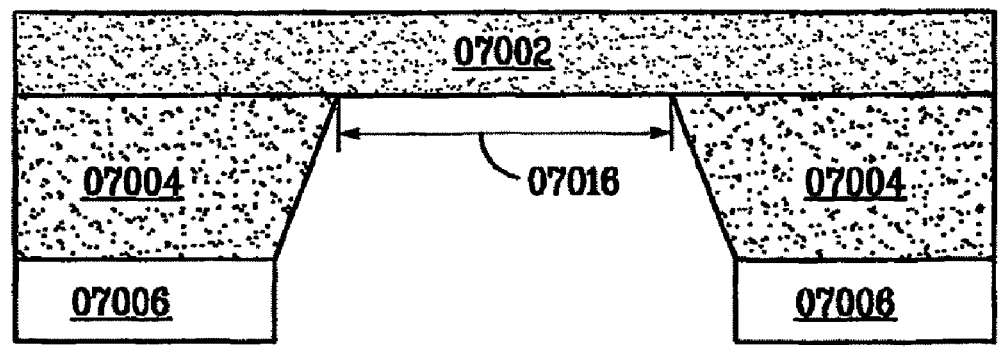

FIGS. 29a-f are schematic illustrations of a method for making a suitable support membrane used in the present inventions. Referring to FIG. 29a, a support material (07004) has a support membrane (07002) on one side and a support membrane (07006) on the other. Suitable support materials include silicon wafers that are commercially available. The two support membranes are not necessarily the same material, but can be. For example, silicon wafers having thin layers of silicon nitride about 5 nm to about 1000 nm thick provided on one or both sides are commercially available for providing a silicon nitride support membrane supported on silicon. FIG. 29b: A layer of an imageable layer (07008) is put onto one of the support membranes, in this embodiment (07006). FIG. 29c: A region (07010) is removed from the imageable layer with a process that can be photolithography or another lithographic procedure. FIG. 29d: A region (07012) is removed from the thin layer (07006). This can be done with a chemical or reactive ion etching technique. FIG. 29e: A region (07014) is removed from the supporting layer (07004). This can be done with a chemical etch. FIG. 29f: Remaining imageable layer can be removed by cleaning. The schematic shown in FIG. 29f is sufficient for subsequent lithographic treatment on the support membrane (07002). One or more nanogaps and other electronic and photonic components and features can be fabricated on the region of the support membrane that spans the opening (07016) in the support layer (07004). One or more other electronic and photonic components and features can also be fabricated on the region of the support membrane that resides above support layer (07004).

Examples And Additional Embodiments

In these examples, lithography was performed on thin $Si_3N_4$ (silicon nitride) support membrane substrates with a thermal-emission JEOL 6400 Scanning Electron Microscope (SEM) operating at its maximum accelerating voltage of 30 kV. The electron beam was controlled with a Raith writing program. The smallest attainable beam diameter on this instrument was ~30 nm. Production of wafers with well defined square regions of free-standing insulator-only material is straightforward to achieve and easy to make in large numbers (Grant, A. W.; Hu, Q.-H; Kasemo, B., *Nanotechnol.*, 2004, 15, 1175). They are also available commercially from Structure Probe, Inc. (SPI), West Chester, Pa., http://www.2spi.com/.

Support membrane substrates were fabricated using a procedure in which doped silicon ($Si^+$) wafers with highly polished, 100 nm-thick low-stress silicon nitride ($Si_3N_4$) layers grown on both sides are first coated with photoresist. Photolithography was then used to remove a square region of the resist, thereby revealing the $Si_3N_4$ underneath. This side of the wafer was then exposed to a $SF_6$ plasma etch, which removes a square of $Si_3N_4$, revealing the $Si^+$ underneath. Finally, the wafer was exposed to a KOH wet etch. The KOH etches anisotropically through the Si along lattices planes until the $Si_3N_4$ on the other side of the wafer is revealed. A free standing support membrane window (in one example, ~50× 50 $\mu m^2$) of 100 nm thick $Si_3N_4$ is therefore defined. These low-stress $Si_3N_4$ support membranes are robust and no special care is required when handling the processed wafers.

The thickness of the $Si_3N_4$ support membrane can be reduced with $SF_6$ reactive ion etching using the procedure described by Reyes-Betanzo, C; Moshkayov, S. A.; Ramos, A. C. S.; Swart, J. W. *J. Vac. Sci. Technol. A* 2004, 22, 1513. In order to calibrate the etching rate, EBL was used to pattern squares into a resist layer on a collection of $Si_3N_4$ support membranes and then exposed each wafer to the $SF_6$ etch for a different amount of time. After removing any remaining resist, the wafers' surfaces were imaged with Atomic Force Microscopy (AFM). AFM height contours were used to determine the etch depth and surface roughness. Surfaces exposed to $SF_6$ plasma at 50 Watts etched evenly at a rate of (1.00+/−0.01) nm/sec. AFM topographical imaging revealed that the etched surfaces were smooth, having an average $\Delta z/\mu m^2$ of ~0.1 $nm^{-1}$. Support membranes were successfully etched down to at least ~10 nm without any damage or irregularities, as indicated by the AFM height contours. TEM imaging is improved as the thickness of the support membrane is decreased and nanostructure self-assembly can be facilitated by the smooth surface. It is easy to evaporate a gate layer onto the back side of the window and fabricate a full FET geometry with a tailored insulating layer thickness. 3.5 nm thick $Si_3N_4$ support membranes grown from a Jet Vapor Deposition (JVD) technique have a dielectric constant of ~7 and a breakdown voltage of $10^7$ V/cm (from source to gate) Ma, T. P. IEEE Trans. Electron Devices 1998, 45, 680, which makes them superior to $SiO_2$ for use as an insulating layer. $Si_3N_4$ support membranes are therefore excellent materials for the purpose of making ultra small FETs and other nano-devices.

A 1 $\mu m$ thick layer of PMMA (950 molecular weight in 4% chlorobenzene) was spin-casted onto the $Si_3N_4$ windows. Nanogaps were written using a 10 pA electron beam in a chamber with pressure below $10^{-6}$ Torr. The resist was exposed to beam doses ranging from 100 $\mu C/cm^2$ to 400 $\mu C/cm^2$ and then developed in MIBK:IPA (3:1) for 60 seconds. For metallization, several nanometers of chromium were evaporated first to act as an adhesion layer between the gold and the substrate. Finally, between 10 and 50 nm of gold were evaporated, though the electrode's thickness is not limited to these values. The wafers were put into acetone at room temperature in order to achieve lift-off. The nanogaps were then imaged with a JEOL 2010F Transmission Electron Microscope.

FIG. 24 shows High Resolution Transmission Electron Microscopy ("HRTEM") images of nanogaps on $Si_3N_4$ support membranes with nanogap sizes from about 1 nm to 12 nm made according to the methods described herein. The high resolution of the images reveals detailed information of the geometry of the nanogap and even the slight variations in the density of the electrodes.

A highly efficient route to fabricating nanometer size electrode nanogaps is provided according to aspects of the present invention. The fabrication is direct and can be achieved by anyone with access to an E-Beam writer. The resultant devices made with these methods are readily imaged using HRTEM because they are fabricated on thin film support membranes. The ability to clearly image the nanogaps allows the quality of the nanogap as well as the details of coupling of samples to the electrical contacts to be analyzed. The value of nanogaps is clear. In addition to their demonstrated potential for use in powerful and exotic new devices, nanogaps represent a landmark in the advancement of modern technology towards bridging the gap between the classical and quantum worlds.

What is claimed:

1. A nanogap fabrication method, comprising:
imaging an imageable layer surmounting a support membrane;
removing the imaged portions of the imageable layer to give rise to at least one nanoscale feature on the support membrane;
adhering a layer of a further material onto the membrane covering at least a portion of at least one nanoscale feature; and
removing the nanoscale features from the support membrane together with the further material adhering to the nanofeature to give rise to said nanogap.

2. The method of claim 1, wherein the support membrane has a thickness in the range of from about 10 nm to about 1000 nm.

3. The method of claim 1, wherein the support membrane is supported on a substrate.

4. The method of claim 3, wherein the support membrane supported on the substrate forms a free-standing support membrane window.

5. The method of claim 4, wherein the free-standing support membrane window has an area in the range of from about $10^{-1}$ square microns to about $10^5$ square microns.

6. The method of claim 4, wherein the free-standing support membrane window is in the shape of a circle, square, rectangle, triangle, or other polygon having 4 or more sides.

7. The method of claim 3, wherein the support membrane comprises silicon nitride, low stress silicon nitride, galium nitride, amorphous carbon, indium arsenide, aluminum oxide, Rare Earth Yttrium Titanium Niobium Oxide Hydroxide, Titanium Oxide, Lead Antimony Oxide Hydroxide, Manganese Iron Oxide, Titanium Oxide, Beryllium Aluminum Oxide, Iron Manganese Niobium Tantalum Oxide, Aluminum Oxide, Copper Oxide, Rare Earth Yttrium Niobium Tantalum Titanium Oxide, Rare Earth Iron Titanium Oxide, Manganese Oxide, Iron Oxide, Hydrogen Oxide, Iron Titanium Oxide, Calcium Titanium Oxide, Magnesium Oxide, Rare Earth Yttrium Titanium Niobium Tantalum Oxide, Iron Titanium Oxide, a member of the Pyrochlore Group, a member of the Rutile Group: Cassiterite Tin Oxide, Plattnerite Lead Oxide, Pyrolusite Manganese Oxide, Rutile Titanium Oxide, Stishovite Silicon Oxide, Samarskite-Y Rare Earth Yttrium Iron Titanium Oxide, Senarmontite Antimony Oxide, a member of the Spinel Group, or any combination thereof.

8. The method of claim 7, wherein the support membrane comprises silicon nitride, low stress silicon nitride, gallium nitride, amorphous carbon, indium arsenide, aluminum oxide, or any combination thereof.

9. The method of claim 7, wherein the support membrane is characterized as having a surface roughness of less than about 10 nm height variation per square micron.

10. The method of claim 1, wherein the imageable layer is a photoresist.

11. The method of claim 10, wherein the photoresist comprises a polymer having a weight average molecular weight in the range of from about 500 g/mol to about 50,000 g/mol.

12. The method of claim 1, wherein the imageable layer has a thickness in the range of from about 10 nm to about 10,000 nm.

13. The method of claim 1, wherein the support membrane is surmounted with the imageable layer by coating the support membrane with the imageable layer.

14. The method of claim 13, wherein said coating includes spin coating, dip coating, ink jet coating, doctor blade coating, microgravure coating, vapor deposition, drop casting, or any combination thereof.

15. The method of claim 13, wherein said coating includes spin coating, vapor deposition, or any combination thereof.

16. The method of claim 1, further comprising the step of removing one or more volatile components from said imageable layer at least prior to said imaging step.

17. The method of claim 16, wherein said volatile components comprises a solvent, a diluent, an oligomer, a polymer fragment, or any combination thereof.

18. The method of claim 1, wherein the step of imaging the imageable layer has a resolution in the range of from about 10 nm to about 100 nm.

19. The method of claim 1, wherein the step of imaging the imageable layer includes electron beam lithography.

20. The method of claim 1, wherein the step of imaging includes exposing the imageable layer to particles or photons of a sufficient energy to break covalent bonds in said imageable layer.

21. The method of claim 20, wherein the step of imaging exposes at least a portion of the imageable layer to electrons with energies sufficient to break covalent bonds in said imageable layer.

22. The method of claim 20, wherein the step of imaging is carried out under vacuum.

23. The method of claim 20, wherein the imaged imageable layer is removed by washing away at least a portion of the imaged imageable layer.

24. The method of claim 1, wherein the at least one nanoscale feature is characterized as having a dimension in the range of from about 1 nm to about 100 nm.

25. The method of claim 24, wherein the at least one nanoscale feature is characterized as having a dimension in the range of from about 1 nm to about 50 nm.

26. The method of claim 24, wherein the at least one nanoscale feature is characterized as having a dimension in the range of from about 1 nm to about 40 nm.

27. The method of claim 24, wherein the at least one nanoscale feature is characterized as having a dimension in the range of from about 1 nm to about 30 nm.

28. The method of claim 24, wherein the at least one nanoscale feature is characterized as having a dimension in the range of from about 1 nm to about 20 nm.

29. The method of claim 24, wherein the at least one nanoscale feature is characterized as having a dimension in the range of from about 1 nm to about 15 nm.

30. The method of claim 24, wherein the at least one nanoscale feature is characterized as having a dimension in the range of from about 1 nm to about 12 nm.

31. The method of claim 24, wherein the at least one nanoscale feature is characterized as having a dimension in the range of from about 1 nm to about 10 nm.

32. The method of claim 24, wherein the at least one nanoscale feature is characterized as having a dimension in the range of from about 1 nm to about 8 nm.

33. The method of claim 24, wherein the at least one nanoscale feature is characterized as having a dimension in the range of from about 1 nm to about 6 nm.

34. The method of claim 24, wherein the at least one nanoscale feature is characterized as having a dimension in the range of from about 1 nm to about 4 nm.

35. The method of claim 24, wherein the at least one nanoscale feature is characterized as having a dimension in the range of from about 1 nm to about 3 nm.

36. The method of claim 24, wherein the at least one nanoscale feature is characterized as having a dimension in the range of from about 1 nm to about 2 nm.

37. The method of claim 24, wherein said dimension is measured in a direction parallel to the surface of the support membrane.

38. The method of claim 37, wherein the dimension is the width of the nanoscale feature.

39. The method of claim 1, wherein the nanogap is characterized as having a dimension in the range of from about 1 nm to about 100 nm.

40. The method of claim 39, wherein the nanogap is characterized as having a dimension in the range of from about 1 nm to about 50 nm.

41. The method of claim 39, wherein the nanogap is characterized as having a dimension in the range of from about 1 nm to about 40 nm.

42. The method of claim 39, wherein the nanogap is characterized as having a dimension in the range of from about 1 nm to about 30 nm.

43. The method of claim 39, wherein the nanogap is characterized as having a dimension in the range of from about 1 nm to about 20 nm.

44. The method of claim 39, wherein the nanogap is characterized as having a dimension in the range of from about 1 nm to about 15 nm.

45. The method of claim 39, wherein the nanogap is characterized as having a dimension in the range of from about 1 nm to about 12 nm.

46. The method of claim 39, wherein the nanogap is characterized as having a dimension in the range of from about 1 nm to about 10 nm.

47. The method of claim 39, wherein the nanogap is characterized as having a dimension in the range of from about 1 nm to about 8 nm.

48. The method of claim 39, wherein the nanogap is characterized as having a dimension in the range of from about 1 nm to about 6 nm.

49. The method of claim 39, wherein the nanogap is characterized as having a dimension in the range of from about 1 nm to about 4 nm.

50. The method of claim 39, wherein the nanogap is characterized as having a dimension in the range of from about 1 nm to about 3 nm.

51. The method of claim 39, wherein the nanogap is characterized as having a dimension in the range of from about 1 nm to about 2 nm.

52. The method of claim 39, wherein said dimension is measured in a direction parallel to the surface of the support membrane.

53. The method of claim 52, wherein the dimension is the width of the nanoscale feature.

54. The method of claim 1, wherein the support membrane is surmounted by an imageable layer on one side of the support membrane.

55. The method of claim 1, wherein the support membrane is unsupported on one side and the imageable layer is surmounted on the unsupported side of the support membrane.

56. The method of claim 1, further comprising one or more additional device fabrication steps.

57. The method of claim 56, wherein the one or more additional device fabrication steps are performed before, during, or after the nanogap is formed.

58. The method of claim 56, wherein the one or more additional device fabrication steps are performed on a side of the support membrane comprising the nanogap.

59. The method of claim 56, wherein the one or more additional device fabrication steps are performed on a side of the support membrane opposed to the side of the support membrane comprising the nanogap.

60. The method of claim 1, further comprising the step of providing one or more nanostructures within at least a portion of the nanogap.

61. The method of claim 1, further comprising the step of providing at least one nanostructure within the nanogap.

62. The method of claim 60, wherein at least a portion of the at least one nanostructure is deposited into the nanogap.

63. The method of claim 60, wherein at least a portion of the at least one nanostructure is synthesized within the nanogap.

64. The method of claim 60, wherein the at least one nanostructure is electronically or photonically coupled to the support membrane, the further material, or any combination thereof.

* * * * *